US006480991B1

(12) United States Patent
Cho et al.

(10) Patent No.: US 6,480,991 B1
(45) Date of Patent: Nov. 12, 2002

(54) TIMING-DRIVEN GLOBAL PLACEMENT BASED ON GEOMETRY-AWARE TIMING BUDGETS

(75) Inventors: Jun-Dong Cho, Millwood, NY (US); David S. Kung, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 09/832,623

(22) Filed: Apr. 11, 2001

(51) Int. Cl.[7] ................................................ G06F 17/50
(52) U.S. Cl. ............................................. 716/8; 716/10
(58) Field of Search ........................... 716/8, 9, 10, 11, 716/12, 13, 15, 16, 17, 14; G06F 17/50

(56) References Cited

U.S. PATENT DOCUMENTS

| | | | |
|---|---|---|---|
| 5,218,551 A | | 6/1993 | Agrawal et al. ............ 364/491 |
| 5,778,216 A | * | 7/1998 | Venkatesh ................... 395/558 |
| 5,926,397 A | * | 7/1999 | Yamanouchi ............... 364/491 |
| 6,086,621 A | * | 7/2000 | Ginetti et al. ................. 703/19 |
| 6,145,117 A | * | 11/2000 | Eng ............................. 716/18 |
| 6,275,784 B1 | * | 8/2001 | Numaguchi ..................... 703/1 |
| 6,360,356 B1 | * | 3/2002 | Eng ............................. 716/18 |
| 6,397,169 B1 | * | 5/2002 | Shenoy et al. ................ 703/14 |
| 6,401,231 B1 | * | 6/2002 | Belkhale et al. ............... 716/6 |

OTHER PUBLICATIONS

Anmol Mathur, et al., "Compression–Relaxation: A New Approach to Timing–Driven Placement for Regular Architectures," pp. 597–608.

Habib Youssef, et al., "Critical Path Issue In VLSI Designs," pp. 520–523.

J. Garbers, et al., "VLSI–Placement Based on Routing and Timing Information," pp. 317–321.

Tetsushi Koide, et al., "A New Performance Driven Placement Method with the Elmore Delay Model for Row Based VLSIs," pp. 405–412.

Ichiang Lin, et al., "Performance–Driven Constructive Placement," pp. 103–106.

Malgorzala Marek–Sadowska, et al., "Timing Driven Placement" pp. 94–97.

Arvind Srinivasan, et al., "RITUAL: A Performance–Driven Placement Algorithm," pp. 825–840.

\* cited by examiner

*Primary Examiner*—Don Wong
*Assistant Examiner*—Trinh Vo Dinh
(74) *Attorney, Agent, or Firm*—F. Chau & Associates, LLP

(57) ABSTRACT

A system and method for timing-closed placement which also takes wirelength and congestion into consideration. In one aspect, the system and method of timing driven placement according to the present invention incorporates a timing budget management technique which satisfies triangle parity and inequality, a timing-driven quadrisection placement strategy based on flexible timing window configurations to minimize the wirelength and congestion during each mincut quad-partition of top-down hierarchy, and a linear programming formulation incorporating bin capacity, channel capacity and congestion criticality.

20 Claims, 16 Drawing Sheets

TIMING-DRIVEN GLOBAL PLACEMENT BASED ON GEOMETRY-AWARE TIMING BUDGETS

BACKGROUND OF THE INVENTION

1. Technical Field

The present invention relates generally to a system and method for designing and placing circuitry on semiconductor chips, and more particularly, to a system and method for incorporating a timing-closed placement solution into a physical design process of integrated circuitry.

2. Description of the Related Art

The development of electronic manufacturing technology has created the ability to build thousands of circuits on a single chip. To take advantage of this technology, thousands of circuits must by physically placed and connected on the chip. This can be a very time-consuming process, especially when the actual process of designing, placing and connecting the circuits on the chip can affect the performance and timing requirements of the chip. Therefore, it has become necessary to automate the design process by using a computer to quickly place and wire predesigned circuits into a functional chip.

The basic problem with this automation technique is that it sacrifices the performance of the resulting circuit for the ability to get a connected circuit in a reasonable amount of computing time. When the functional chip being designed is a central processing unit of a computer or other chip in which performance is critical and design complexity high, the performance sacrificed is not acceptable and the automation technique is not useful. This performance sacrifice usually manifests itself in the inability to obtain timing closure in complicated logic. Timing closure is the difference between the time allowed for processing information on the chip as logically designed, and the time required for processing information on the chip as physically designed.

Timing closure is not met when the chip as physically wired and placed is not as fast as required by the logical design.

With advances in VLSI technology, the size of modules in integrated circuits is becoming smaller and the density of modules on a chip is increasing. Consequently, intramodule delays are becoming smaller, and the total delay in the circuit is being dominated by delays in the interconnections between the modules. The communication-bounded nature of total circuit delay, along with more stringent timing requirements due to more aggressive design style, have made timing driven layout an important area of study. To meet the needs of a fast-expanding electronics industry, high performance chips must be designed in a short period. Accordingly, a design flow which incorporates timing analysis and verification into the physical design is desirable. This motivates the development of layout tools which optimize layout area and timing simultaneously.

The problem of timing-driven placement has been studied extensively over recent years. Existing timing-driven approaches can be broadly classified into net-based methods and path-based methods. In a net-based algorithm, timing constraints are first translated into physical constraints, such as upper and lower bounds on the lengths of nets. More specifically, net-based algorithms try to satisfy timing constraints by (1) assigning higher weights to nets which are part of critical paths, or (2) by transforming timing requirements into a set of upper bounds on the net delays. In scenario (1), minimizing the delay in a critical net may increase the delay in other nets. This may result in additional critical paths and the delays of the nets in these paths also then have to be minimized. This again may result in an excessive delay in the previous critical net. It is desirable to prevent this oscillating effect. In scenario (2) above, delay constraints on the paths are translated into either length or timing lower and upper bounds (slacks) for each net. The bounds are then used to guide the placement and routing. Timing driven placement optimization will not shorten nets that are below the threshold, but nets near or above the threshold are very strongly weighted for improvement. A major problem of these approaches is the selection of the weights or bounds. Also, the use of individual net bounds may overconstrain the problem.

Path-based methods consider timing requirements explicitly, and try to satisfy timing requirements and physical requirements simultaneously during the placement phase. A major difficulty encountered in path-based methods is the enormous complexity of computation. Path-based approaches overcome these difficulties via an optimization process which models the problem using paths instead of individual nets. The problem may be modeled as a linear programming or transforming the quadratic programming problem into a Lagrangian problem to reduce the number of constraints. However, this optimization process becomes very complex and time consuming in deep sub-micron designs.

A legal (or feasible) solution to the timing-driven placement problem should satisfy the following placement constraints: (1) Macros should be placed at legitimate locations without overlapping, (2) there should be sufficient space to implement interconnections, (3) timing constraints should be satisfied for all logically possible paths in the circuit, (4) region constraints should be satisfied, i.e., some modules may be placed only in an certain regions, for example, (a) for movable I/O pins (input/output terminals): some I/O pins' positions may be fixed, others may be assigned to any of the available I/O pads, (b) locations of some modules may already be fixed.

An input to a timing-driven placement problem is a set of modules and a net list, where each module has a fixed shape and fixed terminal locations. The goal is to find the best position for each module on the chip according to appropriate cost functions. Timing driven placement incorporates timing objective functions into the placement problem. Nets that must satisfy timing requirements are called critical nets. In timing-driven placement, it is desirable to make critical nets timing-efficient and other nets length- and area-efficient.

In a net-based timing-driven layout, timing requirements are usually first translated into physical requirements. Delay slacks correspond to budget wiring delays. Slack is the difference between the designed (logical) delay and the actual delay (after added wiring delay) from the wiring program. A positive slack implies that the current cycle-time is fulfilled by the physical layout (i.e., the net meets the design criteria), while a negative value indicates that the layout violates the timing conditions. In addition, a large positive value indicates that the cycle-time can be further improved. Hence, the goal in timing-driven layout is to maximize the min-slack.

The delay budgeting problem seeks to allocate delay slacks before the placement and routing steps. Thus, as a result of delay budgeting, the performance-driven placement and routing steps are given net delay bounds. Since the delay slacks equate with wiring delay, it is natural to expect all nets to have positive slacks. Furthermore, the distribution of these slacks determines the difficulty of finding a feasible placement (and/or routing) solution.

Excessive local congestion gives rise to future routing difficulty and also increases potential crosstalk noise in high-speed signal lines. Furthermore, it increases power dissipation due to coupling capacitance. In a timing analysis of a prerouting design, the routing of a net is usually assumed to be a minimal rectilinear Steiner tree. Due to the congestion, the capacitance (i.e., wirelength) of this routing tree is larger than the one with a minimal Steiner tree. Thus, we need to avoid the timing-critical nets from the congested areas.

Existing timing-driven flows lead to unpredictable and suspicious timing results. Their main flaw is a lack of timing coverage which requires designers to spend days or even weeks iterating between synthesis and layout to achieve timing closure. Extremely complex deep submicron designs requires a new placement algorithm being completed with faster clocks.

There have been many works in timing-driven placement in recent years. Recent results are mainly categorized as: A) Top-down hierarchical partitioning (slack-based), B) quadratic programming (path-based), and C) constructive approaches.

A. Top-Down Hierarchical Partitioning

In top-down hierarchical partitioning, the length of all interconnections are estimated provided that entire cells assigned to a partitioned region are located at the center of the region. Therefore, after each cut of a min-cut algorithm, a global routing is computed. See J. Garbers, B. Korte, H. J. Promel, E. Schwietzke, and A. Seger, VLSI-Placement Based on Routing and Timing Information, IEEE, 1990. This provides an expected net length for every net. These net lengths are subsequently used to perform a timing analysis. In particular, increasing the weight of some nets should lead to a shorter realization of these nets and thus should increase the minimum slack. In this algorithm, modules are not placed at upper levels of the mincut partitioning; the exact module placement is realized at the bottom of hierarchy. Thus, it is hardly guaranteed that the expected net length computed at each level of the hierarchy is consistent with the net length obtained by final placement.

FIG. 1 illustrates an exemplary conventional net-weight and mincut based placement approach. One example of this approach, hierarchical mincut-based partitioning, involves dividing a circuit into smaller parts, recursively. The object is to partition the circuit into parts such that the sizes of the partitions are within a prescribed range and the number of connections between components is minimized at each level of hierarchy. This results in minimizing the number of global wires and accordingly, maximizing the number of local wires, thus minimizing the total wirelength. During the partitioning, if module m1 in partition 100 is moved to partition 102, the result is an undesirable solution since the critical net C with its timing budget of 1 unit is on the cutline 104 and thus may span the entire chip region in a worst case scenario. On the other hand, if module m2 is moved, then the timing budget of net D becomes over-weighted in a smaller wiring region. Therefore, there is a need for a more insightful timing budget management strategy.

In M. Marek-Sadowska and S. P. Lin, "Timing-Driven Placement", IEEE Conference, pp. 94–97, 1989, the timing-driven placement problem was formulated as a facility location problem, for example, for m old facilities located on a plane, locations of additional n-m new facilities are sought. The objective is to minimize the sum of weighted (net-weight based) rectilinear distances between them. Solutions to the problem produce placements of cells only at coordinates of the old facilities (for example, cells with fixed locations such as input/output (I/O) pads). In order to decompose cells into two partitions in the plane, fictitious terminals are added at the cutline that partitions the netlist into two equal-sized netlists.

Usually, bi-partitioning and clustering-based partitioning approaches attempt to cluster critical nets in a local region so that most of the critical nets can reside in close proximity, but some critical paths can easily be divided into different partitions that span a timing-specifically unbounded routing region (i.e., a region where timing is not satisfied). In T. Koide, et al. "A New Performance Driven Placement Method with the Elmore Delay Model for Row Based VLSIs", Hiroshima Univ. koide@ecs.hiroshima-u.ac.jp, during 4-way partitioning, while moving the cell, slack gain is computed, and the cells connecting nets with large slack gains on the cutline may span the timing specifically unbounded routing region. To decrease the delay time of the paths, the cells are moved into clusters within a partition so that nets connecting the cells will span a smaller routing region. However, this method does not guarantee that the final layout of a net does not exceed the timing slack.

B. Quadratic Programming Lagrangian relaxation offers an alternative to simulated annealing for controlling the tradeoff between the system cycle time and wirelength. A. Srinivasan, K. Chaudhary, and E. S. Kuh, "RITUAL: A Performance-Driven Placement Algorithm", IEEE Trans. on Circuits and Systems II, Vol. 39, No. 11. pp. 825–840, November 1992, presented such a mathematical programming approach such that the runtime is smaller than simulated annealing and the quality of the results are reasonable. However, issues like congestion analysis and routability factors are not considered. Routability constraints are among the most difficult because they are not analytical and are checked only by means of routing. This is a major reason why the routability constraints are not included into the mathematical programming formulations.

Another technique involves an algorithm which uses an iterative approach. See A. Mathus and C. L. Liu, Compression-Realization: A New Approach to Timing-Driven Placement for Regular Architectures, IEEE TCAD, Vol. 16, No. 6, June 1997. In each iteration, there is a compression phase and a relaxation phase. The compression phase attempts to make the placement delay feasible by compressing the long paths that cause some of the primary output signals to arrive too late. However, the compression phase may produce an infeasible placement with some of the slots occupied by two modules. This allows the compression phase more flexibility, and often allows it to achieve the required decrease in delay. If an infeasible placement is produced in the compression phase (path-based), the relaxation phase (net-based), which carries out a timing-driven reconfiguration of the infeasible placement to produce a feasible solution, will be executed. Forming a slack neighborhood graph, the delays in the critical paths are guaranteed not to increase beyond a certain bound. It captures,the freedom of movement of the modules, without "violating the timing constraints." If the compression phase produces an infeasible placement, the original modules occupying the overcrowded slots need to be relocated. In the relaxation phase, relocation is carriedout simultaneously for all of the modules in such a way that the delays do not increase by too much. The slack of an edge measures the amount by which the delay of the edge can be increased without violating any timing constraints. The slacks of the edges incident to a module determines the neighborhood within which the module can be moved without violating the timing requirements. In any iterative algorithm for placement, it is initially essential that the mobility of the modules be sufficiently high. This ensures that a bad initial placement does not cause the algorithm to get stuck in a high-cost local minimum. In order to prevent the mobility from being completely governed by the slacks, a relaxation parameter was introduced that allows the algorithm to increase the values of edge slacks which will be referred to as relaxed slacks. In order to incorporate a routability measure into the placement process, each edge of the slack neighborhood graph (SNG) is associated with a cost that measures the penalty, in terms of an increase in congestion, that results from the move associated with that edge. A reasonable measure of this penalty is a congestion gradient that measures the difference in congestion in different areas of the current placement. This approach tries to satisfy the timing constraints for most critical paths, but after spreading out the overlapped modules, it is not guaranteed that the final placement satisfies the timing constraints for entire critical nets.

In most of these timing criticality-based approaches, some of the non-critical nets can turn into the critical nets due, to the unbounded treatment for the wirelength of non-critical nets. In recent aggressive designs, most of the nets are critical and thus a priority-based approach may not be effective.

C. Constructive Approaches

A successive augmentation approach has also been proposed which adds one macro at a time to a partial placement until all macros are exhausted. There are two stages. The first technique involves adaptive changing of parameters according to evaluations of partial solutions. The second technique is carried out by an adaptive look-ahead procedure for improving global characteristics of the placement. The adaptive algorithm uses adaptation of parameters to handle a wider range of operating controls. A set of adjustable parameters such as a timing budget are used to control placement. This approach is effective when dynamic adjustment process can be realized in a reasonable amount of computation. However, this approach lacks global optimization.

Another technique involves a constructive approach based on a path-delay timing window. See I. Lin and D. H. C. Du, "Performance-Driven Constructive Placement", Design Automation Conference, pp. 103–106, 1990. This approach considered a path with a sequence of modules along the path. All modules in the path are bounded in a rectangle called a window to satisfy the timing requirement. Even if all modules are inside the region, a zig-zag routing may result. The basic idea is to define an area to guide the placement of the first module in the window such that the total interconnect delay can be minimized. The net constraints are used to reduce the placement constraints instead of directly using complete path constraints. Once a cell location is determined in a window, all associated paths are broken into two sub-paths.

Previous works lacked the ability to deal with the timing constraints in terms of paths. For example, a timing driven placement method has been presented based on a path delay relaxation force (PDRF) method. The delay of a timing-critical path having a small timing margin is minimized by placing the cells on the path (called path core cells) at the center of gravity, and this process is performed for other path core cells. However, these approaches are only concerned with the timing-critical paths. The cells on the non-critical paths must be treated carefully since their placement may cause further timing problems in recent high performance designs. To deal with this problem, the net constraint driven placement can be utilized. However, the main problem with net constraints is that timing constraints are path based, hence net bounds are usually over-constraining, resulting in infeasible placements. As a result, methods of handling over-constrained net bounds have been proposed but usually rely on re-budgeting only after a physical design step (placement) is completed.

Accordingly, there is a need for a system and method for a very large scale integration (VLSI) placement that efficiently increases production capacity of integrated circuits and accurately optimizes the integrated circuit design.

SUMMARY OF THE INVENTION

The present invention is directed to a system and method for timing-closed placement which also takes wirelength and congestion into consideration. The system and method of timing driven placement according to the present invention incorporates a timing budget management technique which satisfies triangle parity and inequality, a timing-driven quadrisection placement strategy based on flexible timing window configurations to minimize the wirelength and congestion during each mincut quad-partition of top-down hierarchy, and a linear programming formulation incorporating bin capacity, channel capacity and congestion criticality. Advantageously, these features allow good timing-closed placement results to be achieved without excessive computation time, thus accelerating the sign-off-to-silicon cycle for customers and increasing production capacity.

In an aspect of the present invention, a method for placing circuit elements on semiconductor chips is provided comprising the steps of: creating a circuit graph including cutlines, said circuit graph comprising said circuit elements connected by nets: for placement on a placement grid; clustering critical nets in the circuit graph; assigning a timing budget for each net using at least one of a plurality of slack distribution algorithms satisfying at least one geometric constraint; partitioning the circuit graph using a mincut algorithm; generating a timing window region on the placement grid for each net which is less than or equal to each net's respective timing budget; and assigning the circuit elements attached to each net to each of their respective timing window regions.

In another aspect of the present invention, a method for determining placement of circuit elements is provided comprising the steps of: describing a circuit image as a graph comprising circuit elements connected by edges; assigning a timing budget for each edge using a geometry-aware slack distribution algorithm which satisfies at least one geometric constraint; generating a timing window region on a placement grid for each edge, said timing window region being equal to or less than the timing budget for the respective edge; and assigning the circuit elements attached to each edge to each of their respective timing window regions.

These and other aspects, features and advantages of the present invention will be described or become apparent from the following detailed description of the preferred embodiments, which is to be read in connection with the accompanying drawings.

DETAILED DESCRIPTION OF PREFERRED EMBODIMENTS

It is to be understood that the exemplary system modules and method steps described herein may be implemented in various forms of hardware, software, firmware, special purpose processors, or a combination thereof. Preferably, the present invention is implemented in software as an application program tangibly embodied on one or more program storage devices. The application program may be executed by any machine, device or platform comprising suitable architecture. It is to be further understood that, because some of the constituent system modules and method steps depicted in the accompanying Figures are preferably implemented in software, the actual connections between the system components (or the process steps) may differ depending upon the. manner in which the present invention is programmed. Given the teachings herein, one of ordinary skill in the related art will be able to contemplate these and similar implementations or configurations of the present invention.

A basic design model applicable to a timing-driven placement solution according to the present invention involves, for example, a microcell-library sea of gates technology which comprises the following features. A chip has a regular pattern of basic gates. Routing tracks in both directions are distributed between columns and rows and do not produce concentrated routing channels but require over-the-cell routing. This design style has a library of predesigned macrocells in drastically different sizes having varying heights and widths. The number of routing tracks available for inter-macrocell connections depends on the number of tracks utilized by intra-macrocell connections.

Figure 1:
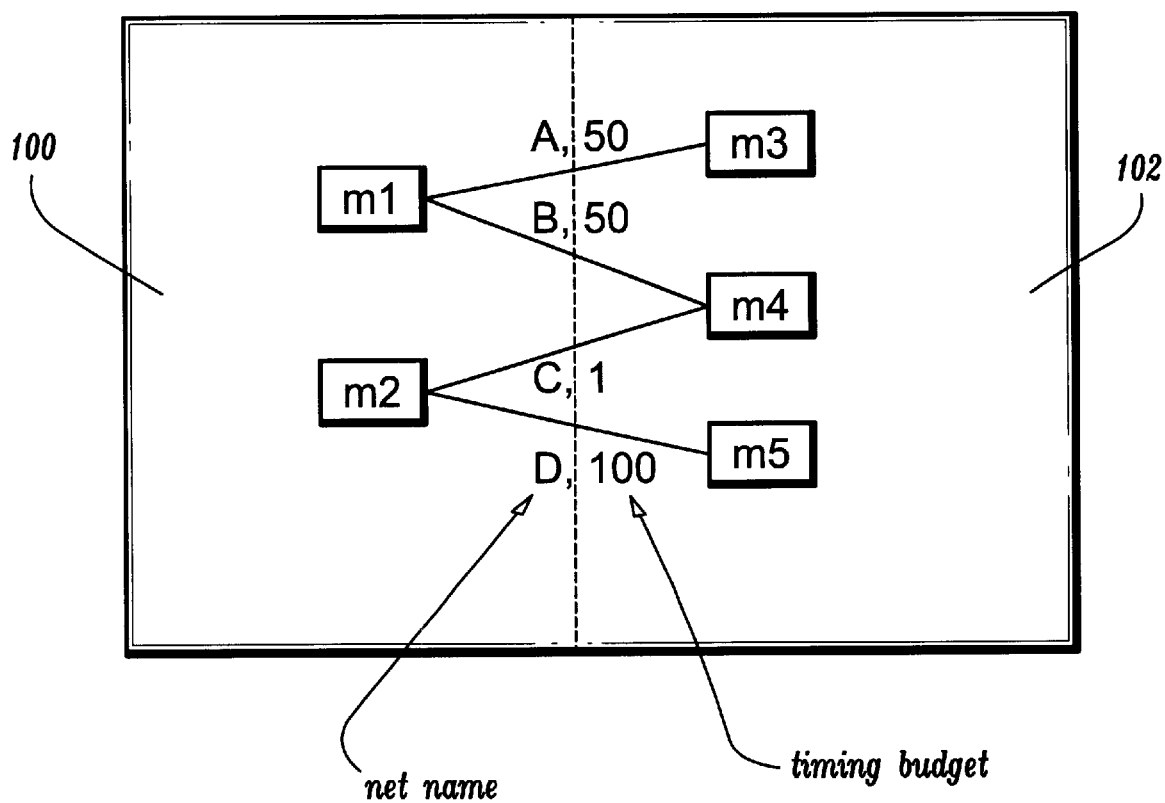
FIG. 1 illustrates an exemplary conventional net-weight and mincut based placement approach.
Figure 2:
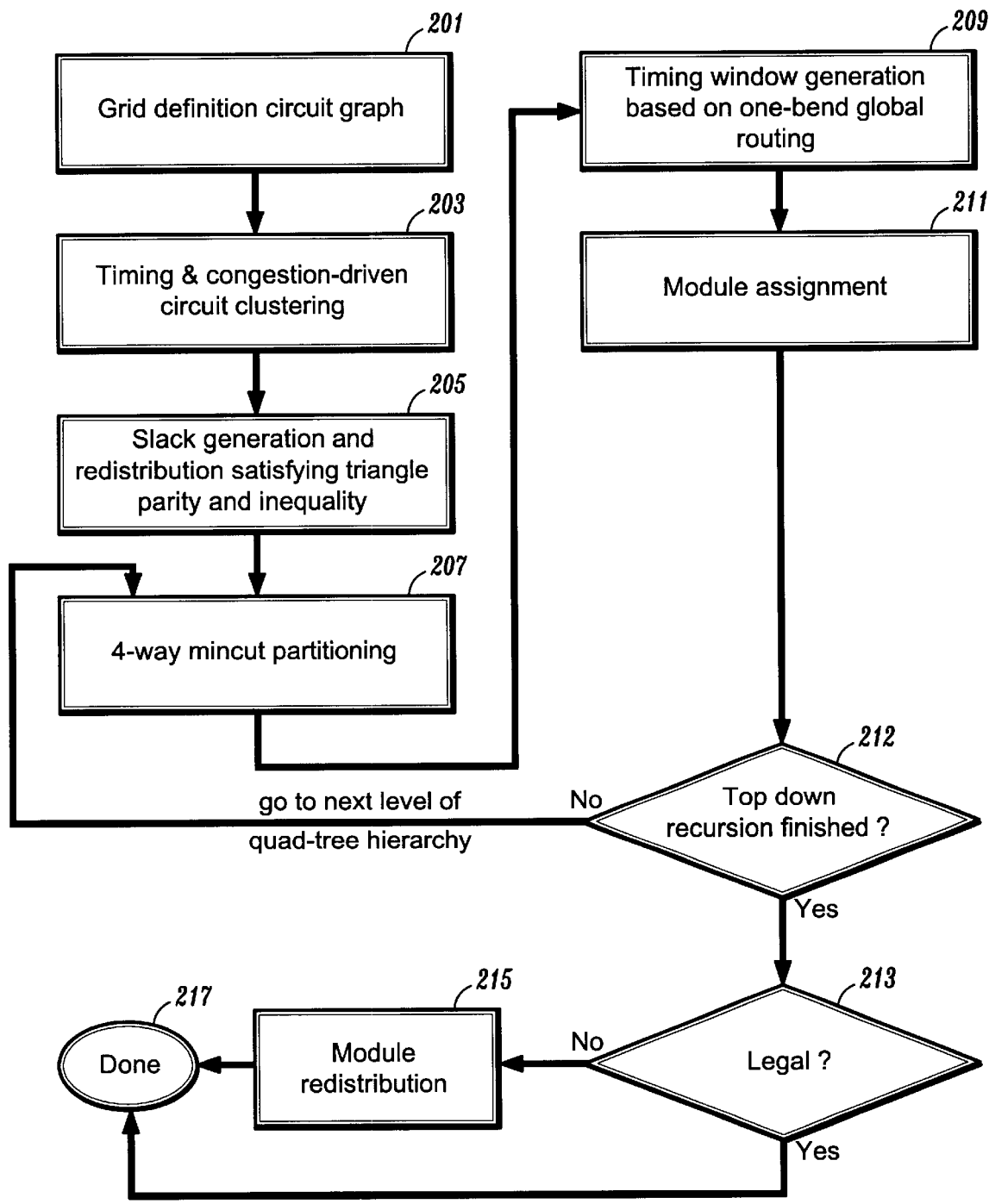
FIG. 2 illustrates a preferred embodiment of a timing driven placement process with timing closure according to an aspect of the present invention.

FIG. 2 illustrates a preferred embodiment of a timing driven placement process with timing closure according to an aspect of the present invention. Initially, in step 201 a circuit graph is created for later defining a timing budget window for each net on a placement grid. The circuit graph comprises, for example, modules (circuit elements) attached to each other by edges (nets), wherein some modules are partitioned by cutlines. The timing budget window is a timing-feasible rectangular area on the placement grid within which modules can be placed without violating a timing budget. Thus, the size of the placement grid affects timing accuracy. One timing slack unit corresponds to, for example, a width of a basic grid size. For example, a timing slack should be set to 1 or 2 if the placement grid forms a 2 by 2 array. In another example, the timing slack can be an integer value between 1 and 6 if the placement grid forms a 4 by 4 array (since a length of the diagonal of the 4 by 4 array is 6).

A multiple of the basic grid size can also be used as a grid size. In this case, a slack should be redistributed into its nearest (with lower slack) grid point. For example, if the size of a bin is 4 timing units, then the new slack value becomes:

$$\left(\frac{\text{old} - \text{slack} - \text{value}}{4}\right)$$

Therefore, the finer (smaller) the grid, the greater the timing budget, and thus the greater the flexibility of placement for finding a feasible solution; however, the computation time is also increased.

For instances where the grid size is more than one unit, a set of critical nets with small timing budgets are clustered into grid bins using a timing-driven clustering algorithm in a bottom-up clustering stage (step 203). Timing-driven clustering involves clustering cells with nets so as to minimize the following function inside each cluster:

$f$(cluster)=timing budget/connectivity

This results in a timing-aware connectivity-based clustering, i.e., nets with a small timing budget will be clustered together into a subgraph having a higher connectivity (density). After finding a set of clusters of the same size, a cluster size corresponds to a grid size. Since the new grid size is larger than the basic (smallest) grid size, the number of components is decreased for future computation. Using this method with an appropriate bin size will be effective in order to reduce the computation time and to take advantage of clustered critical nets.

Next, an initial timing budget for each net is determined using. a geometry-concerned slack distribution algorithm according to an aspect of the present invention, where the timing budget satisfies the triangle inequality rule and tri-angle parity (step 205).

In step 207, the circuit elements are divided into segments to minimize a number of global nets. Global nets are nets which span multiple segments. It is mandatory to use a partitioning approach as design complexity continues to increase. For example, the present invention preferably uses a multi-level graph partitioning mincut algorithm in step 207. In step 209, a timing window is generated within a placement grid based on one-bend global routing. The timing window is a rectangular area within which the modules can be placed without violating their timing budget. A one-bend global routing (a wire having one bend between modules) is preferable to, for example, a two-bend routing, since the more the number of bends, the more vias and thus, the more delays.

Next, the modules are assigned to their respective timing window regions on the placement grid (step 211). Preferably, each module is assigned to a more general rather than specific bin on the placement grid. The exact placement of the modules are deferred to a lower level of hierarchy. This flexibility leads to a better mincut solution in the successive levels of hierarchy. To minimize congestion during the module assignment process, timing-feasible regions for each module are determined by selecting the region (or bin) which best distributes wires evenly over the cutlines.

The larger the size of the timing windows, the greater the probability of finding a feasible solution (i.e., a solution which reduces the possibility of cell overlaps), and thus, the more flexibility of reducing the total wirelength during top-down partitioning hierarchy. In addition, straight connections between the modules are desirable to reduce the possibility of congestions (cell/module overlap) and the number of bends. Thus, the objective is to maximize the timing window sizes and the number of straight-line connections.

Following module assignment, it is ascertained whether the recursive top-down partitioning is finished, i.e., whether all levels of the top down hierarchy have been processed and all modules in the circuit graph are assigned (step 212). If not, the system goes to the next level of hierarchy and repeats the process starting from step 207 again.

If the top-down recursion is finished, it is then ascertained whether the module assignments are legal, i.e., whether the module capacity of each bin is not exceeded (step 213). If yes, then the process ends (step 217). Otherwise, a module relocation technique is executed (step 215). The above steps of the overall method will now be described in more detail below.

I. Net Delay Model and Slack Redistribution

It is desirable to determine the initial timing budget for each module before synthesis since good initial timing-budgeting should shorten the number of resynthesis iterations and thus speed up the entire design process. For example, initially, the total timing slack (budget) in the path can be distributed equally over the nets in each path. If a path does not meet its constraint, all the nets in the path are targeted for improvement until the path as a whole falls below a threshold constraint.

In a budget refinement problem, paths may have positive or negative slacks as a result of a given placement. Since the budgeting results are heuristic in nature and may be over-tight (i.e., overly constraining), it is necessary to provide a method by which the budgeting algorithm can adjust the timing budget based on, for example, information on results from a failed placement. Given a directed acyclic graph with timing constraints, the object of budget management is to assign to each vertex an incremental delay such that the total sum of these delays is maximized without violating given constraints. A maximum effective budget can maximize the flexibility and freedom all signal nets can have during layout while keeping within the timing constraints, which is desirable for most placers and routers.

Figure 3:
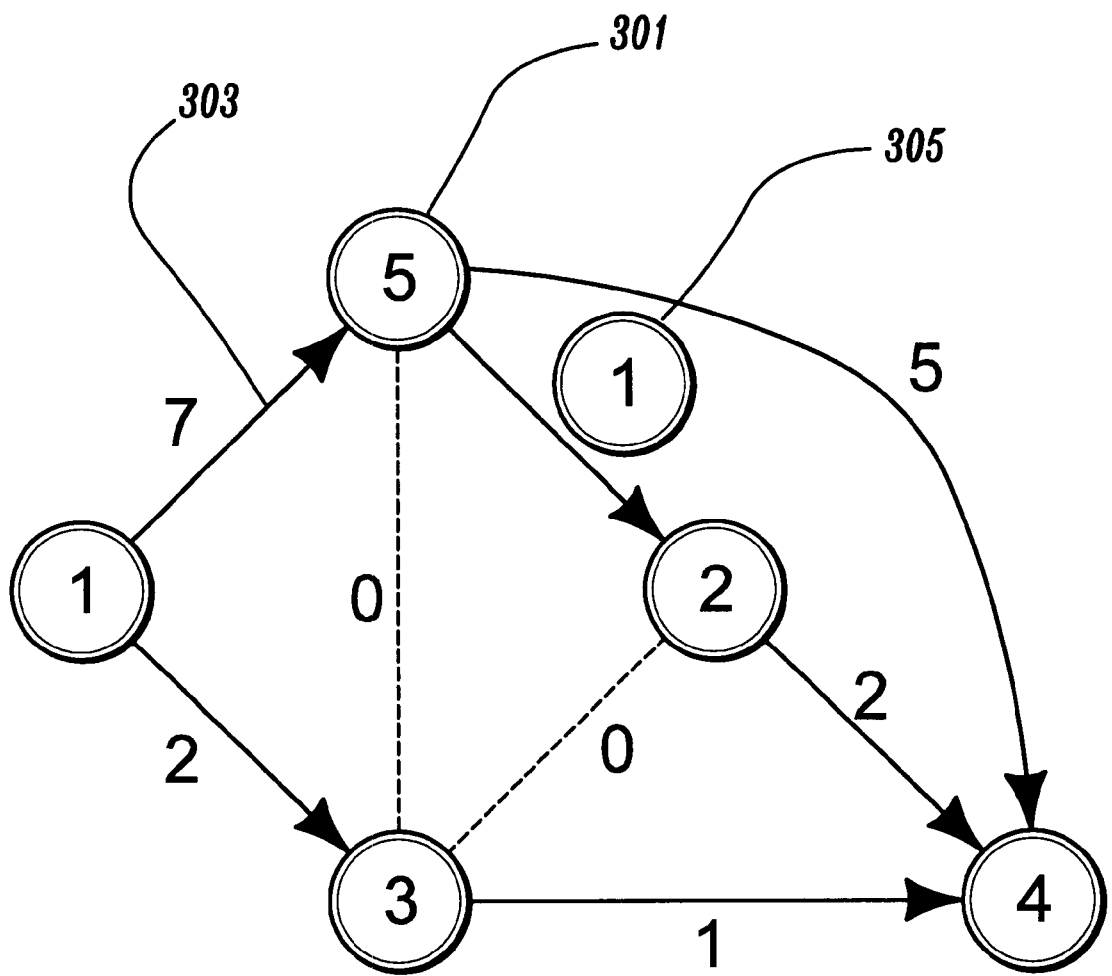
FIG. 3 illustrates an exemplary circuit graph comprising nodes connected by edges having slack values.

FIG. 3 illustrates an exemplary circuit graph comprising nodes 301 connected by edges or nets 303 having slack values 305. The total slack here (does not include values for the dotted line) is for example, 18. A timing analysis as illustrated, for example,. in Youssef, E. Shragowiz, and L. C.Bening, "Critical path issue in VLSI designs," in Proc. Int. Conf. on Computer-Aided Design, pp. 520–523, 1989, can be performed to identify a set of critical nets. A critical net is a net which belongs to at least one critical path. A net weight. is set proportional to the frequency of appearance of a critical net in a set of critical paths. The net weights are then used to weigh the driving strength of the nets. Weight implies a measure of priority, and a smaller timing budget implies critical nets. Therefore, a critical net will be characterized by a higher value on the timing weight and a lower value on a budget.

The critical path of a very large circuit contains a hundred-pin net, which causes more than 50% of the entire maximum.path delay. As seen from an Elmore delay model, one long wire in a multi-terminal net will affect the delay of the entire net. Therefore, it is desirable to put special emphasis on reducing the lengths of nets with high numbers of pins (terminals). Thus, a lower timing budget is assigned in proportion to a greater number of terminals of the net.

The most critical net may contain a buffer chain and/or drives large fanouts. Therefore, the criticality (i.e., timing budget) of net i, $\tau(i)$, in path j is measured as follows:

$$\tau(i) = \tau(j) \times \left(1 - \frac{a\eta(i) \times \beta\varphi(i)}{\sum_{k=1}^{n(j)} a\eta(\kappa) \times \beta\varphi(\kappa)}\right),$$

where is $\tau(j)$ is total-timing-budget of path j, n(i) the number of nets in a path i, $\eta(i)$ is the multiplicity of net i and $\phi(i)$ is the frequency factor associated with net i. Here, $\alpha$ and $\beta$ are the relative weights between $\eta(i)$ and $\phi(i)$ such that $\alpha+\beta=1$. The delay budget s(e) on an edge e can be transformed on the wirelength l(e) by using the Elmore delay model, $R_d(cl(e)+C_I)+\frac{1}{2}\ crl(e)^2+rl(e)C_L=s$ (e), where $R_d$ is the driver resistance, $C_L$ is the load capacitance, and c and r is the unit capacitance and resistance respectively.

After slacks are generated, slack redistribution is performed by initially determining a maximum effective slack for each path segment. This can be done by: 1) computing all slacks, and 2) distributing the slacks along the path segment based on the criticality measures; i.e., a net with a higher criticality measure will have a lower timing budget. For example, a net (edge) shared by two different paths is assigned a lower timing budget than a net which is part of a single path. The above two steps are repeated until there are no positive slacks on any nodes.

A set of critical nets can be identified either prior to module placement (static method) or during module placement (dynamic method). In a static method, the set of controlled critical nets does not change during the layout process. Preferably, instead of using the time-consuming dynamic method, the method of the present invention adopts a static timing budget management technique which uses a lookahead function to determine a feasible placement.

To ensure that a final module placement results in a feasible solution in terms of timing constraints while simultaneously minimizing wirelengths, the placement satisfying the timing budget is realized by careful treatment for instances where a circuit includes cycles in its corresponding circuit graph. Since wires are connected rectilinearly, the following triangle parity inequality rule must be satisfied prior to placement:

$$P(w_i+w_j)=P(w_k), \forall i, j, k \in C \text{ of } G,$$

where $P(w_i)$ is the weight parity (i.e., edge weight is even or odd) of edge i with its weight $w_i$, and C is a cycle in the graph G. Equivalently, if $(w_i+w_j) \mod 2 = w_k \mod 2$, then $P(w_i+w_j)=P(w_k)$. To have one-bend routing for every net in a cycle, every cycle of length three (referred to as a 3-cycle) should comply with the triangle inequality rule. Otherwise, a placement problem will result in which the timing budget will not be satisfied. The triangle property of an undirected cycle is a property that a complete weighted cycle satisfies $s(u, v) \leq s(u, w)+s(w, v)$ for all vertices u, v, w, where $s(i, j)$ is the timing slack (margin) for the net connecting two cells i and j. This holds for any graph representing points in both Euclidean and rectilinear (Manhattan) metric space, for example, a placement graph. Therefore, both the triangle inequality rule and a parity rule should be met for satisfying timing constraints.

Figure 4A:
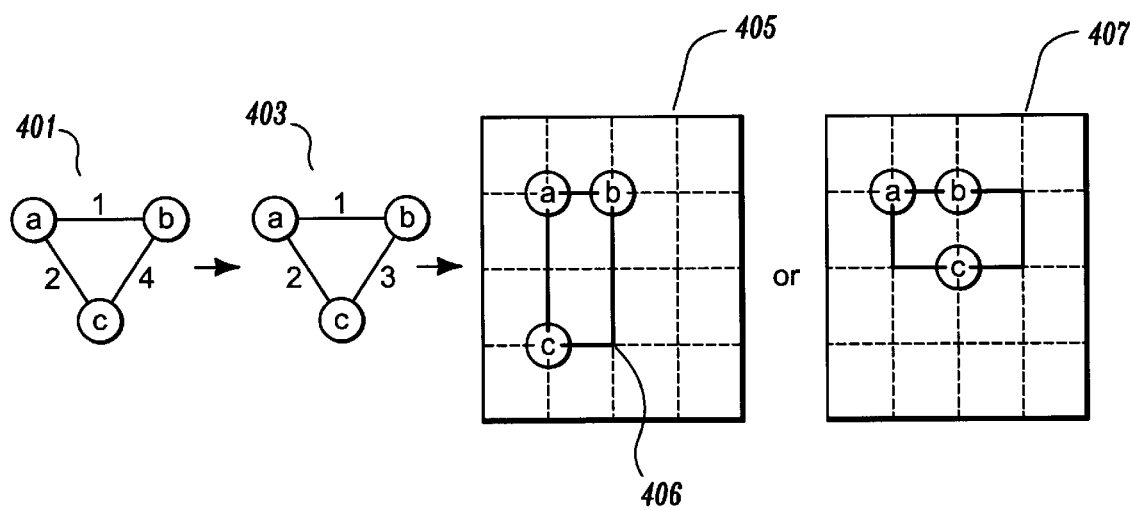
FIG. 4A illustrates an exemplary placement of a slack-weighted circuit graph which has its slack modified to satisfy the triangle inequality rule and a parity rule according to an aspect of the present invention.

FIG. 4A illustrates an exemplary placement of a slack-weighted circuit graph which has its slack. modified to satisfy the triangle inequality rule and a parity rule according to an aspect of the present invention. Circuit graph 401 is an exemplary cycle of length three which is not feasible for placement due to its edges having weights which do not satisfy the triangle inequality rule or the parity rule. The parity rule involves an integer quality (i.e., whether an edge weight is an odd or even number). For example, for the parity rule to be satisfied in a 3 cycle circuit graph, adding any two edges should result in a number which has a same parity/quality (i.e., odd or even) as the third edge. In addition, the triangle inequality rule is not satisfied in 401. To satisfy the triangle inequality rule (which applies only to 3 cycle graphs), when the weights of any two edges are added, their sum should be greater than or equal to a weight of the third edge.

Circuit graph 403 is an exemplary cycle of length three which satisfies both the triangle inequality rule and the parity rule, and is thus feasible for placement. The triangle inequality rule is satisfied since the sum of any two edges in 401 is greater than or equal to the third edge. For example, the sum of the values of edges a-b and b-c (which is 4) is greater than the value of the edge a-c (which is 2). To illustrate the satisfaction of the parity rule in graph 403, if the values of edges a-c and a-b are added (2+1), they will equal an odd number (3) which is a same parity as the third edge b-c (also an odd number).

Placement graph 405 illustrates an exemplary rectilinear-wired placement of circuit graph 403 using one-bend routing. For example, there is one-bend 406 in the wire between nodes b and c. One-bend routing is preferable for placement since it results in a shortest path and thus a shorter wirelength. The circuit graph 403 can also be placed using two-bend routing (407). However, it is very time-consuming to formulate the two-bend routing in Linear Programming. Furthermore, the more bends, the greater the wirelength and detours and thus the more delays. Thus, two-bend interconnections between modules are preferably avoided, if possible.

Figure 4B:
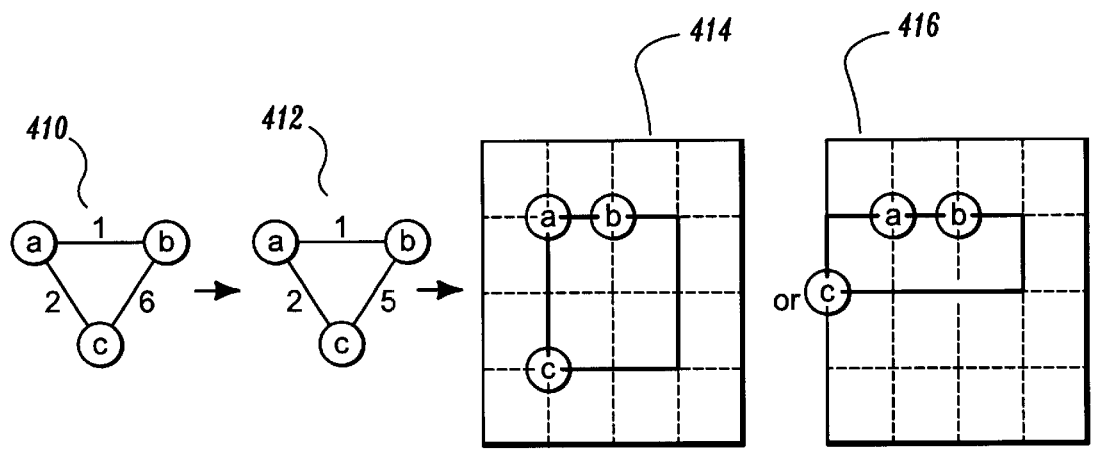
FIG. 4B illustrates an exemplary placement of a circuit graph which does not satisfy the triangle inequality rule.

However, there are cases where two-bend routing must be used. FIG. 4B illustrates an exemplary placement of a circuit graph which does not satisfy. the triangle inequality rule. Circuit graph 410 is infeasible since it does not satisfy either the triangle inequality of parity rules. Note that the weight of an edge (b, c) in graph 410 should be set to less than 3 to hold the triangle inequality property of placement. Circuit graph 412 satisfies a triangle parity rule, and thus is feasible for placement. However, in this case, we need to two-bend wire for the edge (b, c) as shown in placement graphs 414 and 416. If a legal solution satisfying channel capacity constraints cannot be found with one-bend routing, than two-bend wires are permitted to be used.

Figure 5:
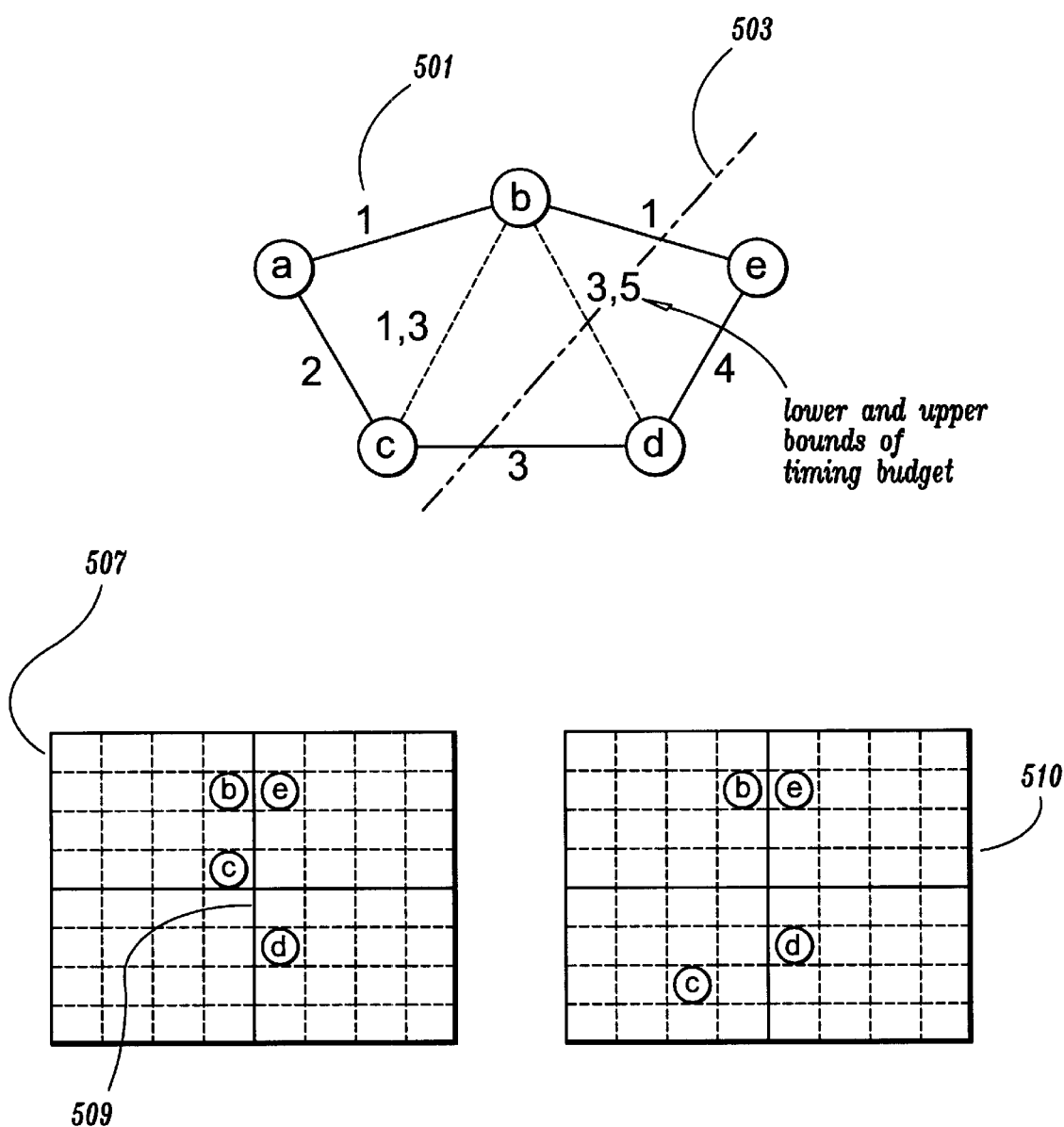
FIG. 5 illustrates an exemplary slack-weighted circuit graph and a resulting feasible placement solution and an infeasible placement solution.

It is important to note that in both FIGS. 4A and 4B, during placement, the triangle inequality must be satisfied. FIG. 5 illustrates an exemplary slack-weighted circuit graph 501 and resulting feasible and infeasible placement solutions. Graph 501 comprises three cycles (a, b, c), (b, c, d) and (b, d, e) and a cutline 503 for partitioning the modules d and e from a, c and b during placement. Edges c, b and b, d include upper and lower bounds of a timing budget. It is desirable to maintain the triangle inequality for each cycle during placement, while the original slack values of each edge can be used to provide wiring flexibility.

Placement 507 represents an exemplary placement of modules b, c, d, e of graph 501 using a lookahead timing budgeting of edge b, c in which the triangle inequality property is satisfied during placement. Placement cutline 507 is analogous to the cutline 503 for partitioning the modules b, c and e, d in different partitions. Placement 507 results in a timing-legal placement for module a. Placement 510 illustrates an exemplary infeasible placement solution where the triangle inequality rule is not satisfied during placement. Here, there is no feasible placement for module a which would satisfy the timing constraints given in graph 501.

Given a directed graph with timing and geometric (triangle inequality and parity) constraints, the object of budget management according to an aspect of the present invention is to assign to each node an incremental delay such that the total sum of these slack delays is maximized without violating given constraints. A maximum effective budget advantageously increases the flexibility and freedom of all signal nets during layout while keeping within the timing constraints. Initially, an optimal algorithm for budget management is used to identify the edges that have initial slack values which need to be reduced or transferred. Then, a rebudgetting strategy is employed to maximize the total slack values.

To compute the timing budget assignment complying with the triangle inequality rule and timing (path) constraints (referred to as Triangle-based Rebudgetting) according to an aspect of the present invention, either. of the following algorithms can be applied:. 1) Geometry-constrained Slack Reassignment, or 2) Geometry-constrained Rebudgetting. The first algorithm does not allow for a net to increase its originally assigned timing margins, but only to reduce their values, while satisfying triangle inequality for every cycle. The second algorithm aims to maximize the total timing margins while preserving the triangle inequalities. Thus, in the second algorithm, timing margins assigned to nets are allowed to be increased.

The basic idea of the first algorithm is to build a spanning tree from a graph where during the tree construction, edge weights are checked and updated (re-assigned) to satisfy both triangle inequality and triangle parity. Basically, in Timing Budget Reassignment, Deque(Q) is to extract the cheapest (lowest weighted) edge (u, v) in a graph G from a priority queue Q, and Enque (Q, s(u, w)) is to insert a new value s(u, w) to Q.

The overall Timing Budget Reassignment algorithm is as follows:

Geometry-constrained Slack Reassignment (GSRA):
    Until Q is empty,
        1. s(u, v)=Deque(Q);
        2. If the edge. (u, v) is incident to another edge (v, w) that is already traversed and they both form a cycle with another edge (u, w) (that has not yet been traversed) in G and s(u, w)≧s(v, w)+s(u, v), then the following is set: s(u, w)=s(v, w)+s(u, v) and Enque (Q, s(u, w));

3. If the edge (u, v) is incident to another edge (v, w). that is already traversed and they both form a cycle with another edge (u, w) (that has not yet been traversed) in G and s(u, w)≦s(v, w)+s(u, v) and s(u, w)mod2≠(s(v, w)+s(u, v))mod2, then the following is set: s(u,w)=s(u, w)−1 and Enque(Q, s(u, w));

4. If the edge (u, v) is incident to another edge (v, w) traversed so far and there is no edge (u, w) in G, then a dummy edge (u, w) is added to the graph G and the following is set: s(u, w)=s(v, w)+s(u, v) and Enque (Q, s(u, w));

5. If the edge (u, v) creates a cycle with two edges, s(v, w) and s(u, w) already traversed in G, then the following is set: s(u, v)=s(v, w)+s(u, w) and Enque (Qs(u, v));

At each step in the above algorithm, a cheapest edge is selected. A cycle-completing edge is more expensive than any previously added edge, thus the edge weight can be updated to satisfy the triangle inequality rule without changing other edges in the cycle that have already been traversed. The above algorithm for Budget Reassignment takes at most $O(|E|\log|E|+|N|^2)$ amount of time, where $|E|$ is the number of edges and $|N|$ is the number of nodes in the graph.

Given an initial budget assignment, when budget increases on some edges are not allowed, the Timing Budget Re-assignment algorithm finds an optimal solution for incremental budget assigning such that every cycle in the graph satisfies the triangle inequality rule.

It may be necessary to minimize the amount of timing budget updating through the timing budget assignment algorithm since it results in a tighter timing budget, and thus, there will be less possibility of finding a legal timing-driven placement solution.

To avoid reducing the total timing budgets, the following rebudgetting strategy can be used:

Rebudgetting is a labeling of the node r: V→Z, where Z is the set of integers. The rebudgetting label r(v) for a node v represents the amount of timing slacks moved from its output toward its inputs. The weight of an edge (u, v) after rebudgetting is denoted by:

$$s'(u, v)=s(u, v)+r(v)-r(u)$$

Let the total timing slacks of a circuit after rebudgetting be denoted by $S(G')=\Sigma_e S'(e)$. The maximum rebudgetting problem can be stated as maximizing S(G'), subject to timing constraints. One can rewrite:

$$S(G') = \sum_e (s(e) + r(v) - r(u)) = S(G) + \sum_v (|FI(v)| - |FO(v)|)r(v),$$

where |FI(v)| and |FO(v)| are the number of fanins and fanouts of node v. The maximum rebudgetting problem can then be formulated as the following linear program.

Minimize:

$$\sum_v (|FO(v)| - |FI(v)|)r(v),$$

Subject to:

$$s(u, v)+r(v)-r(u)\geq 0$$

The objective function above represents the timing margin gains added to the rebudgetted circuit in relation to the original circuit. The constraint ensures that the s(e) for each edge e after rebudgetting is non-negative. This is referred to as a positive slack constraint.

The maximum rebudgetting problem can be reduced to the minimum cost network flow problem. Each edge (u, v) can be regarded as a network flow arc having infinite capacity and cost s(u, v) per unit of flow. The goal of the linear programming problem given asks that each edge is assigned a non-negative flow f(u, v) such that:

Maximize:

$$\sum_{(u,v)} s(u, v) f(u, v)$$

Subject to:

$$\sum_{v\to} f(e) - \sum_{\to v} f(e) = |FO(v)| - |FI(v)|$$

Figure 6A:
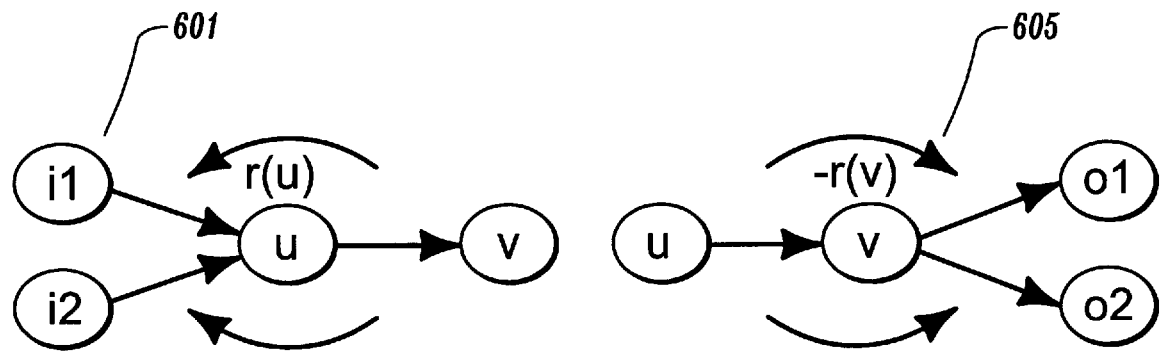
FIG. 6A depicts exemplary illustrations of rebudgeting where positive gains on the timing margins are realized.

FIG. 6A depicts exemplary illustrations of rebudgeting where positive gains on the timing margins are realized. Rebudgeting with positive gains on the timing margins can be done using the following two operators: forward and backward rebudgetting. For example:

1. If |FO(v)|≧|FI(v)| (forward rebudgetting) then, $$r(v)=r_{min}(v)(=\min_e(s(e)), e\in FI(v)), \text{ and } g(v)=(|FO(v)|-|FI(v)|)r(v);$$

2. If |Fi(v)|>|FO(v)| (backward rebudgetting) then $$r(v)=r_{min}(v)(=\min_e(s(e)), e\in FO(v)), \text{ and } g(v)=(|FI(v)|-|FO(v)|)r(v)$$

Path 601 illustrates an example of backward rebudgetting where r(u) (that is, an edge value of u, v) is rebudgetted to each of its fanin edges $i_1$,u and $i_2$,u. This results in a positive gain on the total timing margin. Path 605 illustrates an example of forward rebudgetting where r(v) is rebudgetted to each of its fanout edges (v, $o_1$) and (v, $o_2$). If either of these backward or forward rebudgetting techniques are used, then the overall timing budgets will be increased to g(v)= (|FI(v)|−|FO(v)|)r(v) and g(v)=(FI(v)|−|FO(v)|)(−r(v)), respectively.

Figure 6B:
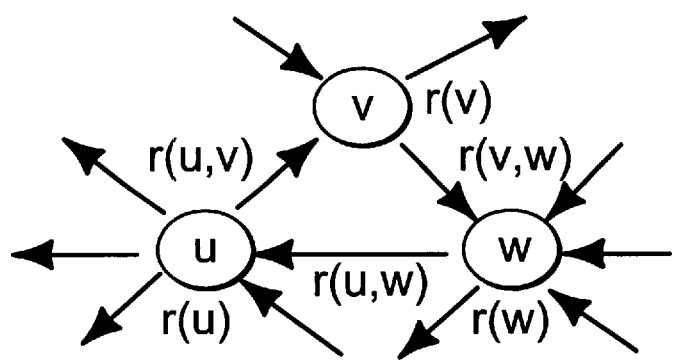
FIG. 6B illustrates an exemplary circuit graph depicting variables to be used for rebudgetting while preserving triangle inequalities.

Based on the above rebudgetting strategy, a Geometry-Constrained Rebudgetting problem that satisfies the triangle inequality s(u, v)>s(v, w)+s(w, u) for every cycle in graph G can then be formulated as the integer linear program below. In this case, a new variable w must be introduced to create r(u, v), r(v, w), r(w, u) in addition to r(u), r(v), r(w). FIG. 6B illustrates an exemplary circuit graph depicting variables to be used for rebudgetting while preserving triangle inequalities. These variables are, required to find a solution satisfying triangle inequalities.

Therefore, Geometry-Constrained Rebudgetting is a labeling of the node r: V→Z and the edge r: E→Z in a directed circuit graph G=(V, E), where Z is the set of integers. Here, it is assumed that a graph $G^A$ is given that has been triangulated, for example, by performing Geometry-constrained Slack Reassignment.

Geometry-constrained Slack Rebudgetting ($G^2R$)

Maximize:

$$g(u)+g(v)+g(w)-r(u, v)-r(v, w)-r(w, u), \forall (u, v, w)\in G,$$

where g(u)=(|FI(u)|−|FO(u)|)r(u), g(v)=(|FI(v)|−|FO(v)|)r(v), and $$r(w)=(|FI(w)|-|FO(w)|)r(w)$$

Subject to: (here, considering the case of triangle (u, v, w) in FIG. 6B)

Constraint 1:

$$s'(u, v)+s'(v, w) \geq s'(w, u)$$

$$s'(u, v)+s'(w, u) \geq s'(v, w)$$

$$s'(u, w)+s'(w, u) \geq s'(u, v)$$

where $$s'(u, v)=s(u, v)+r(v)-r(u)-r(u, v)$$

$$s'(v, w)=s(v, w)+r(w)-r(v)-r(v, w)$$

$$s'(w, u)=s(w, u)+r(u)-r(w)-r(w, u)$$

$$s(u, v) \geq r(u, v) \geq 0$$

$$s(v, w) \geq r(v, w) \geq 0$$

$$s(w, u) \geq r(w, u) \geq 0$$

$$s(PI, u) \geq r(u) \geq -s(PO, u)$$

$$s(PI, v) \geq r(v) \geq -s(PO, v)$$

$$s(PI, w) \geq r(w) \geq -s(PO, w)$$

Constraint 2:

$$s(w, u)-r(w, u) \geq r(w)-r(u)$$

$$s(u, v)-r(u, v) \geq r(u)-r(v)$$

$$s(v, w)-r(v, w) \geq r(v)-r(w)$$

Constraint 3:

$$|r(u)| \leq r_{min}(\rightarrow u), r(u) \leq 0$$

$$|r(v)| \leq r_{min}(\rightarrow v), r(v) \leq 0$$

$$|r(w)| \leq r_{min}(\rightarrow w), r(w) \leq 0$$

$$r(u) \leq r_{min}(u \rightarrow), r(u) \geq 0$$

$$r(v) \leq r_{min}(v \rightarrow), r(v) \geq 0$$

$$r(w) \leq r_{min}(w \rightarrow), r(w) \geq 0$$

where
$r_{min}(\rightarrow i)=\min_e(s(e)), e \in FI(i)$
$r_{min}(i \rightarrow)=\min_e(s(e)), e \in FO(i)$ The objective function above represents the timing margin gains added to the rebudgetted circuit in relation to the original circuit. That is, the total slack gain G after performing the $G^2R$ algorithm will be:

$$G=g(u)+g(v)+g(w)-r(u, v)-r(v, w)-r(w, u))$$

Here s(w, PI) is the sum of timing margins on the edges in the shortest path from w to primary inputs, and s(w, PO) is the sum of timing margins on the edges in the shortest path from w to primary outputs. This value is used as a lower and upper bound for each of the retimed variables r(e).

The second and third constraints ensure that the s(e) for each edge e after rebudgetting is non-negative. Constraint 2 and Constraint 3 are redundant since Constraint 1 implies Constraint 2 (by adding two inequalities in Constraint 1), and Constraint 2 implies Constraint 3, respectively. Therefore, only Constraint 1 is needed.

A host node h is introduced that sources all "primary inputs" and sinks all "primary outputs" with dummy edges (edges having zero weight) connecting the host node with all primary inputs and primary outputs. A vertex u is strongly connected to v if two paths exist: one from a to b and another from b to a. Then:

Lemma 1 The graph G'(V', E'), where V'=V∪h, and E'=E∪ (h, i), ∀i∈PI, ∪(h, o), ∀o∈PO is a strongly connected graph.

Corollary 1 If G=(V, E) is a strongly connected graph, then r(u, v)≥0, ∀(u, v)∈E of G.

Lemma 2 In graph G'(V', E'), a feasible solution can be found without explicitly specifying lower and upper bounds for the retimed variables in the following LP formulation.

Note that the original circuit graph G=(V, E) is usually neither a strongly connected graph nor a triangulated graph. Graph G is transformed into: $G^{AC}=(V^C=(V \cup h), E^{AC}= (E^C \cup E^A)$, where EC are the augmented imaginary edges connecting the host node with primary and primary outputs, and $E^\Delta$ is the augmented imaginary edge after graph triangulation. The graph triangulation (forming a complete graph) can be done by running the Geometry-constrained Slack Reassignment algorithm (however, at this time without updating the slack values).

If there are still timing problems, the following algorithm (satisfying both triangle inequality and parity) can be applied:

Geometry-aware Slack Re-Budgetting on G, GSRB($G^2R$):
Maximize:

$$g(u)+g(v)+g(w)-r(u, v)-r(v, w)-r(w, u), \forall (u, v, w) \in E,$$

where g(u)=(|FI(u)|−|FO(u)|)r(u), g(v)=(|FI(v)|−|FO(v)|)r(v), and r(w)=(|FI(w)|−|FO(w)|)r(w), and FI(i) (resp. FO(i)) is the number of fanins (resp. fanouts of i∈V of G.

Subject to:

$$r(i)-r(h) \geq 0, \forall i \in PI$$

$$r(h)-r(o) \geq 0, \forall o \in PO$$

$$s'(u, v)+s'(v, w) \geq s'(w, u)$$

$$s'(u, v)+s'(w, u) \geq s'(v, w)$$

$$s'(v, w)+s'(w, u) \geq s'(u, v)$$

where if (u, v), (v, w), (w, u)∈E then $$s'(u, v)=s(u, v)+r(v)-r(u)-r(u, v)$$

$$s'(v, w)=s(v, w)+r(w)-r(v)-r(v, w)$$

$$s'(w, u)=s(w, u)+r(u)-r(w)-r(w, u)$$

else if (i, j)∈$E^\Delta$, then $$s'(i, j)=d(i, j)$$

$$s'(i, j) \geq 1, \forall (i, j) \in E \cup E^\Delta$$

Here the variable r(i), ∀i∈(V∪h) is unconstrained, but the value is always positive because of introducing the host node, the variable r(i, j)≥0, ∀(i, j)∈E, and the variable d(i, j)≥0, ∀(i, j)∈$E^\Delta$. PI(G) (resp. PO(G)) is defined as the set of nodes that has no incoming (resp. outgoing arcs) arcs in G. The last constraint is required to avoid cell overlaps in the same location.

Figure 7A:
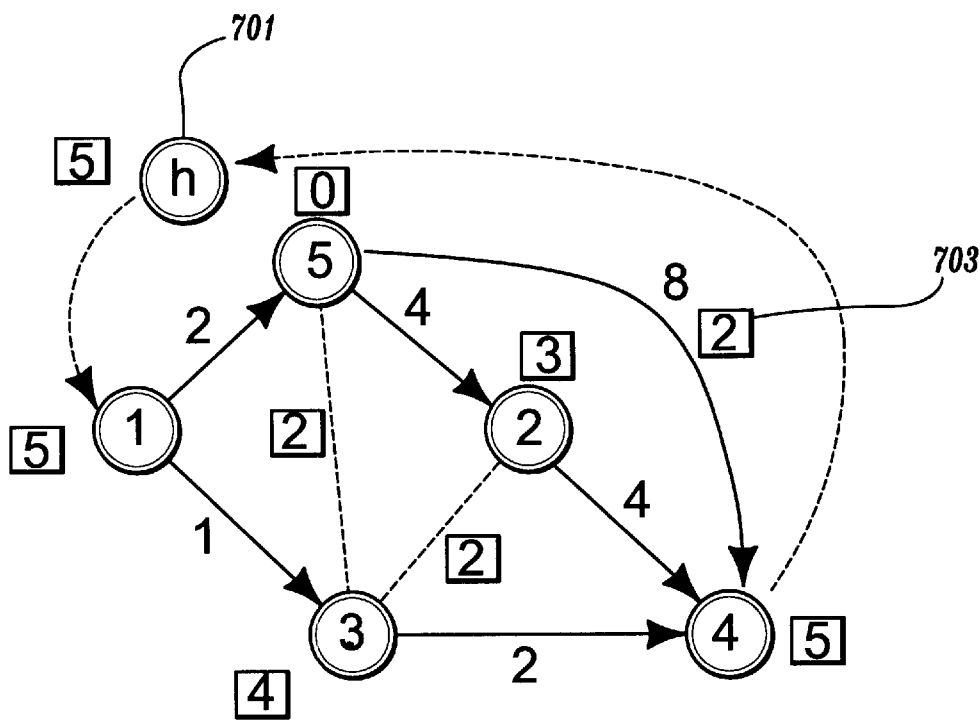
FIGS. 7A–7B are exemplary illustrations of rebudgeting results using geometry-aware slack distribution (rebudgetting) algorithms applied to the circuit graph of FIG. 3 according to an aspect of the present invention.
Figure 7B:
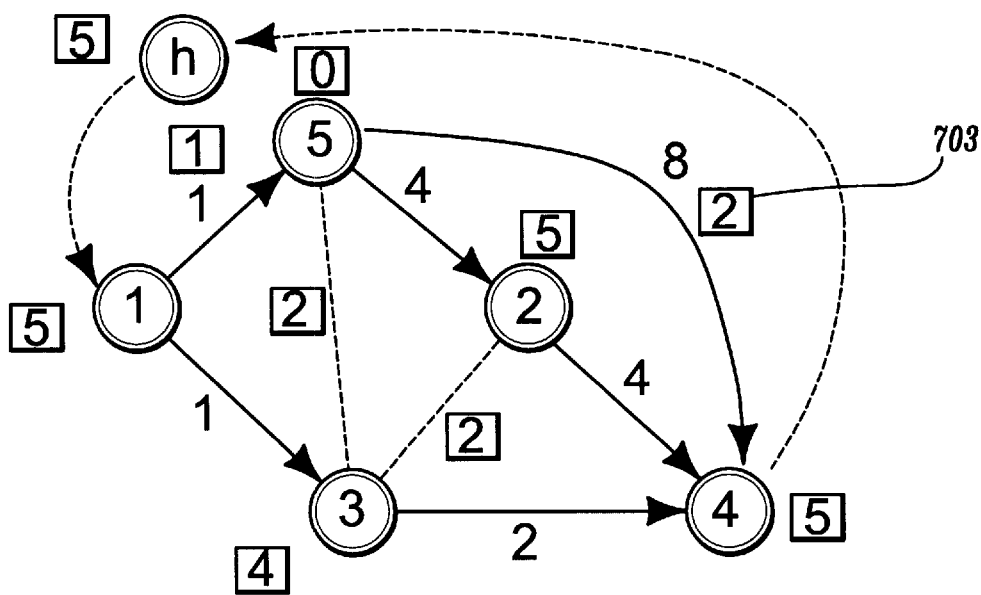

FIGS. 7A–7B are exemplary illustrations of rebudgeting results using geometry-aware slack distribution (rebudgetting) algorithms applied to the circuit graph of FIG. 3 according to an aspect of the present invention. The goal in rebudgetting the slacks is to maximize the total slack while satisfying the triangle inequality rule. FIG. 7A illustrates slack rebudgetting which satisfies the triangle inequality rule. Here, the total slack is increased to 21. Host node h(701) is introduced to propagate a retimed value of 5 from a fanin edge h,1 to fanout edges 1,5 and 1,3, and so forth (the rebudgetting is done through all the paths in a continuous loop). The values in boxes 703 represent the retimed slack results for each node using the GSRB algorithm. It is to be noted that the total slack amount of 21 does not include the values 703.

Figure 7C:
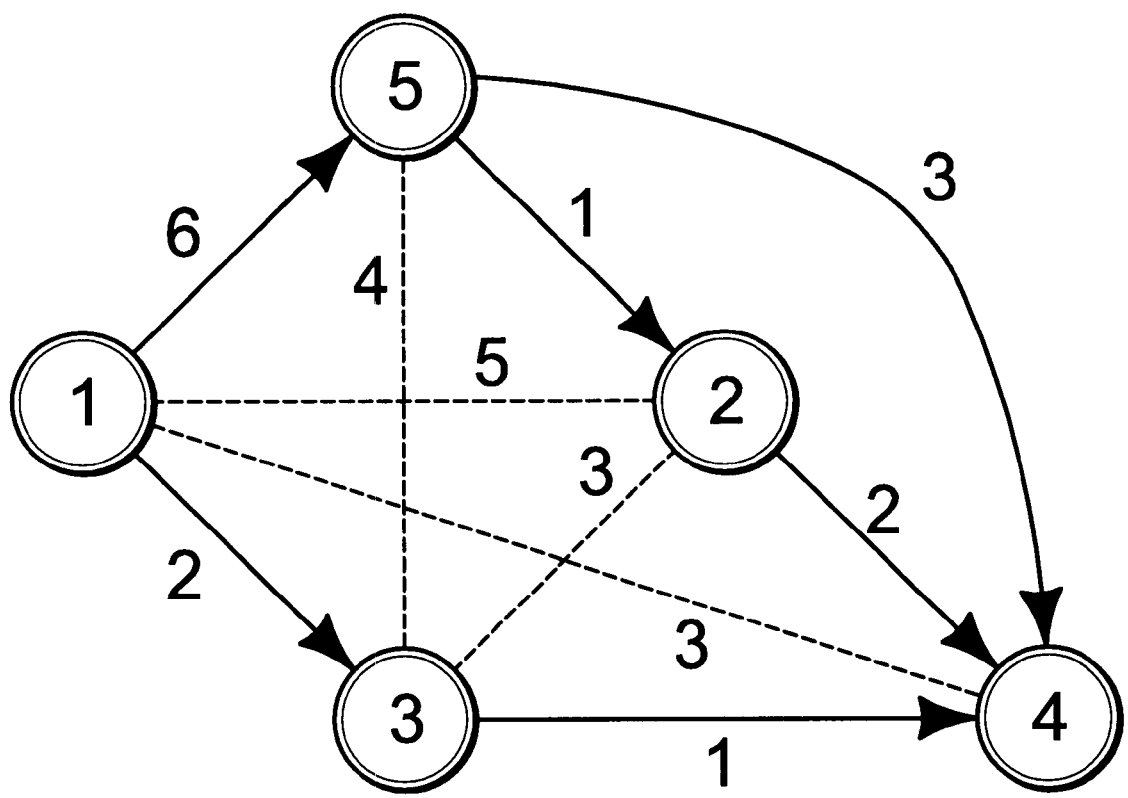
FIG. 7C illustrates an exemplary slack reassignment satisfying the triangle inequality rule according to an aspect of the present invention, where the slack is not rebudgetted.

FIG. 7B illustrates slack rebudgetting which satisfies both the triangle inequality rule and parity. Here, for example, the total slack is increased to 20. FIG. 7C illustrates an exemplary slack reassignment satisfying the triangle inequality rule without rebudgetting the slack. Although the slack reassigment algorithm is a much faster algorithm, it does not maximize the total slack; in fact, it reduces it (for example, here the total slack is 15).

Compared with the initial circuit graph of FIG. 3, applying the GSRB algorithm results in a slack gain of 3 units (from 21 to 18), while applying GSRA reduces the total slacks by 3 units (from 18 to 15). Note that triangulization does not affect the total timing slacks since the total slacks are maximized on circuit edges (shown in solid lines in FIGS. 7A–7C) only.

To incorporate the triangle parity constraints mentioned above, for each cycle (u, v, w) in graph G, the following additional constraints are needed:

$$s(u, v) = a_0 2^0 + a_1 2^1 + a_2 2^2 + a_3 2^3 + \ldots + a_k 2^k$$

$$s(v, w) + s(w, u) = b_0 2^0 + b_1 2^1 + b_2 2^2 + b_3 2^3 + \ldots + b_k 2^k$$

$$a_0 = b_0,$$

where $a_0, a_1, \ldots a_k, b_0, b_1, \ldots b_k$ are 0, 1 variables, and k is the maximum value such that $a_0 2^0 + a_1 2^1 + a_2 2^2 + a_3 2^3 + \ldots + a_k$ is less than the maximum slack value in G.

Since the overall timing budgets on each path has not been increased, we have a situation where both GSRA and GSRB generate a solution which satisfies timing constraints.

II. Timing-Driven 4-Way Multi-Level Mincut Partitioning

Once a timing budget is assigned for each net, the circuits are divided into segments in a partitioning step using, for example, a multilevel partitioning mincut algorithm. The objective of the mincut partitioning step is to divide the circuits into a required number of segments to minimize the number of global nets (i.e., nets which span multiple segments). It is mandatory to use some partitioning approach as design complexity continues to increase. The partitioning problem can be formed as follows:

Given a graph G=(V, E) with weights on the edges and vertices and a parameter φ, find a partitioning of the vertices of G into φ sets in such a way that the sums of the vertex weights in each set are as equal as possible, and the sum of the weights of edges crossing between sets is minimized.

A brief description of an overall partitioning algorithm is as follows:

Algorithm Multilevel Timing-concerned Partitioning (MTP):
1. Perform Connectivity-aware Slack Reassignment (CSRA) on G=(V, E).
2. Until G is small enough (e.g., |V|=5000):
   G=coarsen(G); (i.e., minimize the timing budget by clustering)
3. Perform GSRA or GSRB on the coarsened graph G and perform Congestion-Aware Timing-Driven Partitioning CAP(i) on G.
4. Until the coarsened graph G=original graph G:
   uncoarsen the graph;
   partition the uncoarsened graph as described in Step 3 using CAP(i).

Mincut is effective for minimizing the number of nets crossing the cutline (cut nets) in the upper level of hierarchy, thus the wirelength can be decreased for the highly connected networks in the smaller region of the lower level of hierarchy. (The graph formed by the cut nets will be referred to as $G^C$).

There are three different stages in a multilevel graph partitioning algorithm. Initially, a sequence of smaller and smaller graphs is created from the original graph (coarsening). Then, the smallest graph in the sequence is partitioned carefully (partitioning). Next, the partition is propagated back through the sequence of grids (uncoarsening), with an occasional local refinement. A solution is approximated using a fast heuristic such that the computational costs of constructing coarse graphs and the local improvement algorithms are both proportional to the number of edges in the graph.

Cell congestion (i.e., cell overlaps) is closely related to the partitioning strategy. By maximizing the minimum timing budget of the nets crossing the cutlines during partitioning, advantageously, the probability of finding a legal (i.e., where cells have no overlap) solution is increased. Cycles having a smaller radius (slack margin of the net crossing cutline diagonally) and a smaller diameter(sum of slack margins assigned to nets in the cycle) formed by paths crossing cutlines result in cell overlaps. These cycles are known as critical cycles. To reduce the possibility of cell overlaps, during partitioning, such critical cycles are minimized.

Maximizing the timing budget during partitioning can be done during timing-driven clustering in the multilevel partitioning. That is, cell congestion (cell overlap) is correlated with slack distribution. In order to minimize the possibility of cell overlaps (and thus maximize the porosity), the following weighted cell overlap contribution metric can be used:

$$d_{cell} = \sum \sum_{s=1}^{s_{max}} \frac{1}{\gamma(s)} n_s$$

where $\gamma(s) = s(2s+2)$, the number of grids in the rectilinear circle with rectilinear radius minus 1. Here, the:

$$\frac{1}{\gamma(s)}$$

indicates the probability of cell overlaps. The same result can be obtained by using a clustering, thus $d_{cell}$ is not included in cost function of partitioning. Thus, a new congestion-driven mincut cost incorporating wire and cell congestion will be $C = d_{wire} + (1-)d_{cell}$, where C is a cost function and  measures the relative importance between dwire and dweil, and can be found by linear regression from the result of routing.

To meet the objective of congestion mitigation being consistent in terms of wirelength, we first apply a mincut algorithm with the cost function C and apply the GSRB algorithm to G with a new objective function such that we maximize the timing budgets on $G^C$ and minimize the timing budgets on $G-G^C$. In this manner, strongly connected clusters are assigned lower timing budgets and weakly connected clusters are assigned greater timing budgets. This slack budget management is referred to as Connectivity-aware Slack Re-assignment (CSRA).

After applying the above multilevel partitioning algorithm (MTP), critical cycles are evenly distributed over the plane and appear in the low level of the top-down partitioning hierarchy. Alleviating the congestion in a local area is equivalent to evenly distributing the layout resource elements (cells and wires) over the entire chip area. Thus, at each level of top-down hierarchy, a quad-tree partitioning strategy is performed:

Quad-tree partitioning is an approach to region representation based on the successive subdivision of a plane into quadrants. This process can be represented by a quad-tree. A root node corresponds to the entire plane. Each son of a root node represents a quadrant. Each root node comprises four quadrants labeled in counter clock-wise order $Q_1$, $Q_2$, $Q_3$, and $Q_4$, from the right upper quadrant and four cutlines $C_1$ (between $Q_1$ and $Q_2$), $C_2$ (between $Q_2$ and $Q_3$), $C_3$ (between $Q_3$ and $Q_4$) and $C_4$ (between $Q_4$ and $Q_1$). The total timing slacks assigned on nets in $q_i$ during partitioning is denoted by $s(q_i)$. The total cell area assigned in $q_i$ during partitioning is denoted by $a(i)$. The capacity of cutline $c_i$ is denoted by $d(c_i)$. The total timing slacks assigned on the nets crossing the cutline ci is denoted by $s(ci)$, and the total number of nets crossing the cutline $c_i$ is denoted by $n(c_i)$. Leaf nodes of the quad tree correspond to a grid cell or a region with a functional block for which no further subdivision is necessary. A leaf node is occupied by basic cells, functionalblock, or clusters.

$Q(i)$ denotes the quadrant region where cell i is assigned to and $w(i, p)$ denotes the timing window region generated by $s(i, p)$, which is the timing slack between cell i and I/O cell p.

The timing-driven partitioning problem can be effectively solved by an assignment technique in which each module and net is assigned to one of the four timing-closed quadrants. The assignment technique can be formulated as a linear programming algorithm (described below). The smaller the total slacks on the cutlines, the higher the probability of finding a feasible solution, which reduces the possibility of cell overlaps in future placements at a lower level of the top-down.partitioning hierarchy, and thus the more flexibility in reducing total wirelength during the top-down partitioning hierarchy.

Congestion-Aware Timing-Driven Partitioning (CAP(i)) on G=(V, E):

Minimize $$\sum_{i=1}^{4} n(i)$$

Subject to:
Cutline Capacity Constraints:

$n(i) \leq d(c_i)$, $i=(1, 2, 3, 4)$

Cut-nets Distribution Constraints:

$$n(i) \geq \frac{n}{2^{i+1}(m+1)},$$

where the right hand side is the low bound on channel capacity, n is the number of nets and m is the chip size.

Bin Capacity Constraints $ab(i) \leq avgAU$, $i=(1, 2, 3, 4)$ where $ab(i) =$ $$area - modules(q_i) + \frac{area(c_i : \text{cutlines adjacent to } q_i)}{2} + area - nets(q_i)$$

and avg $$avg\ AU = \frac{ws \times S + wb \times B}{4},$$

where ws is wire unit area, S is the total slacks in G, and wb is cell unit area and B is the total number of modules in G.
The upper-bound avgAU=avgAU+a.
Bin Resources Distribution Constraints:

$ab(i) \geq avgAL$, $i=(1, 2, 3, 4)$

The lower-bound: avgAL=avgA−a
Timing Constraints:

$q(i) \cap w(i, P) \neq 0$, $i \in V$

The overall placement algorithm is as follows:
Geometry-Aware Top-down Placement (GTP)
1. Partition a circuit graph into 4 subgraphs by performing a multilevel timing-concerned partitioning (MTP) to find a mincut and to assign each of the subgraphs into a quadrant so as to satisfy the timing constraints between already placed cells (e.g., I/O pads) in a previous level of the top-down hierarchy and subgraphs.
2. Perform Timing Window Generation and Module Assignment (described in the following section) for nets crossing 4 cutlines. Assign each net to channels on the four cutlines creating a pseudo-terminal. The fixed channel location of the pseudo terminal on the cutlines acts as an I/O pad for the quadrants, $q_1$, $q_2$, $q_3$, and $q_4$ (i.e., terminal propagation).
3. Repeat the above procedures for each subgraph $q_i$ until a leaf node of the quad-tree is reached.

In step 1 above, path slacks between the already-placed cell in a previous level and the cell in the current level of the top-down hierarchy need to be checked. In the second iteration of GTP, one of the partitioning constraints δs(qi), as described above, is adjusted to further alleviate congestion.

II. Timing Window Generation and Module Assignment

Figure 8A:
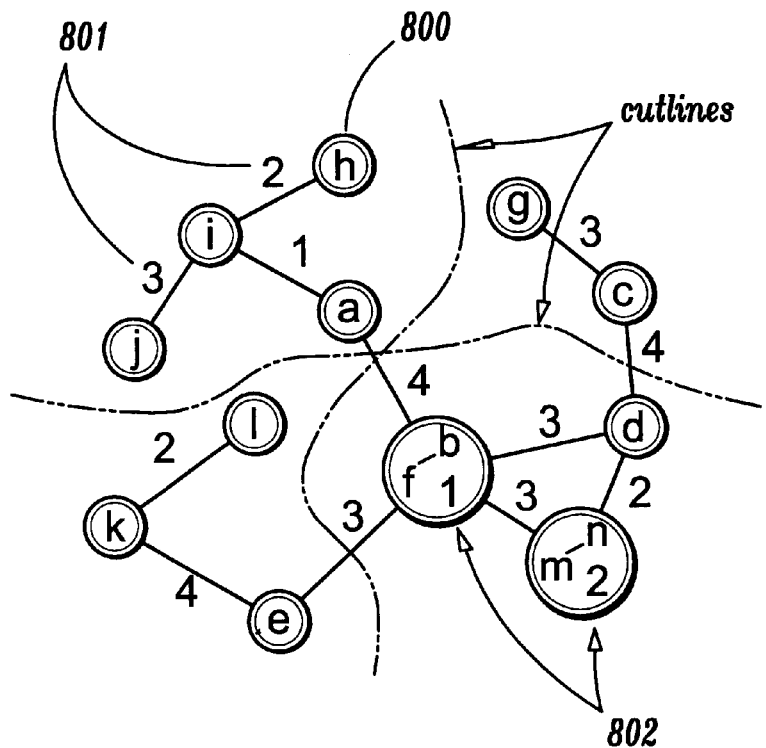
FIGS. 8A–F illustrate an exemplary overall application of a method of module placement according to an aspect of the present invention.
Figure 8B:
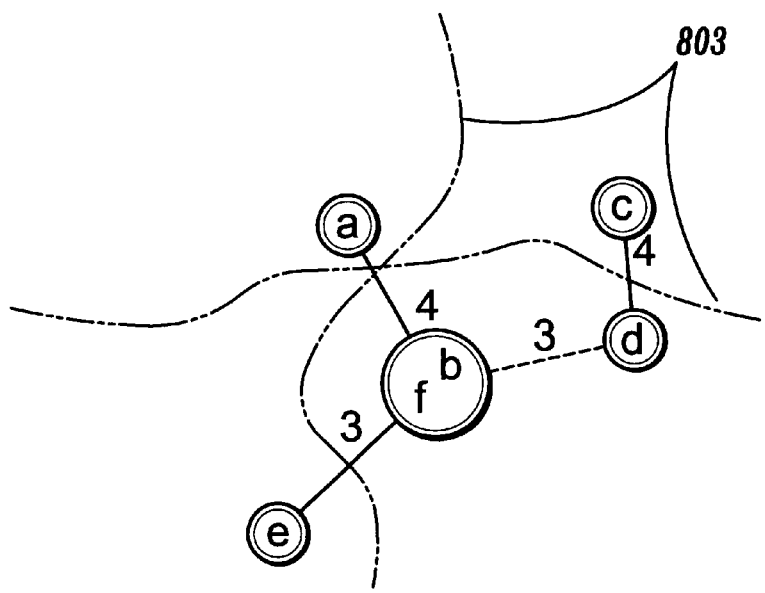
Figure 8C:
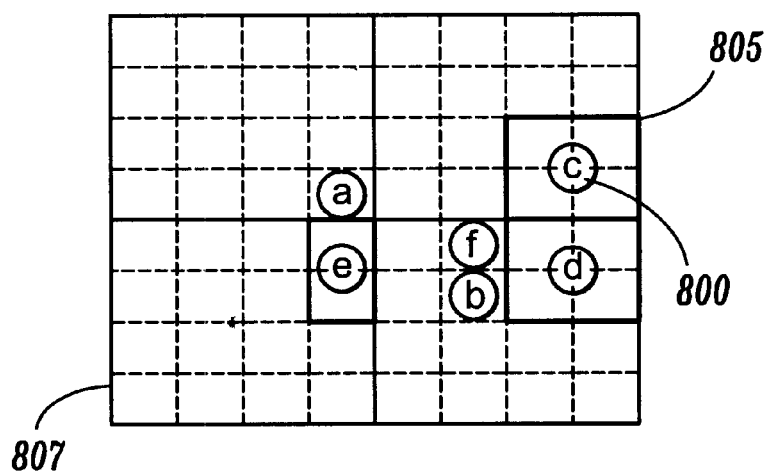
Figure 8D:
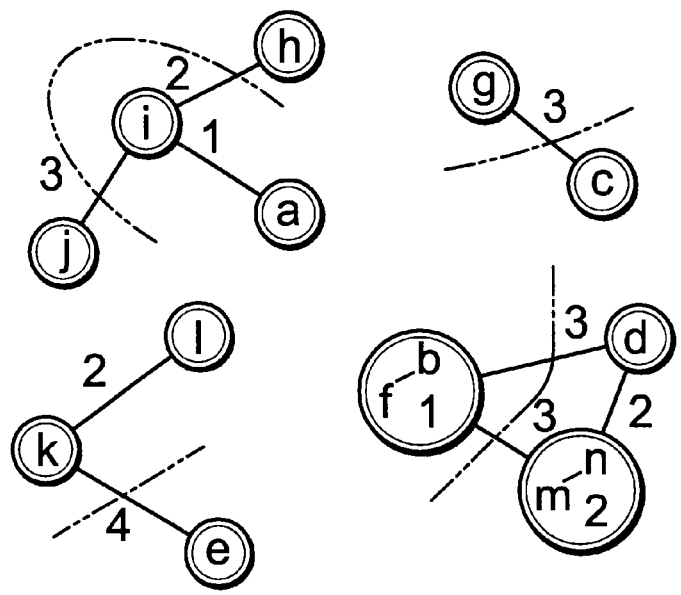
Figure 8E:
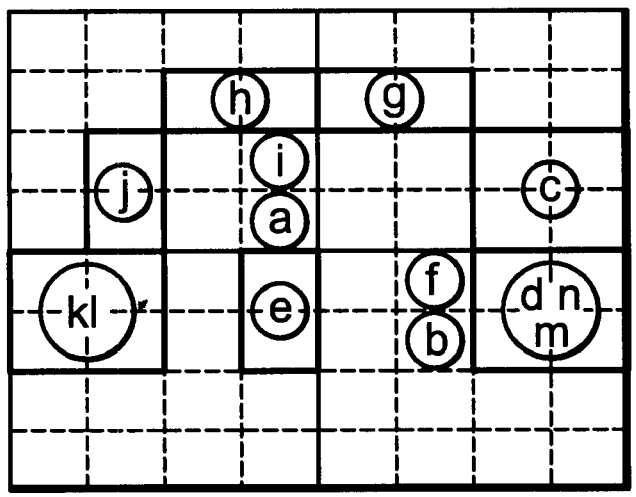
Figure 8F:
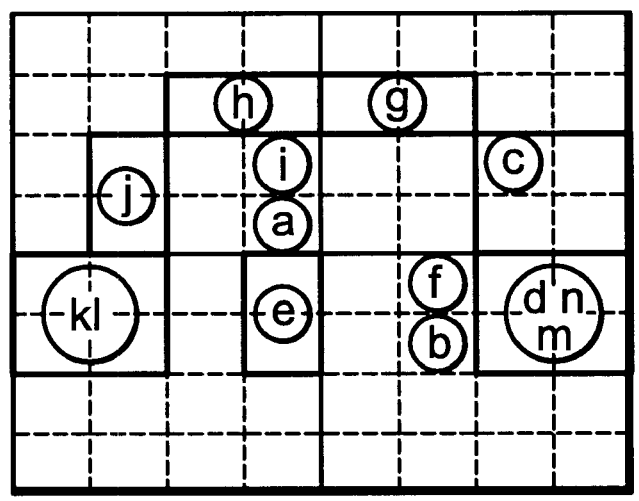

Next, a module assignment algorithm is performed at each level of the mincut hierarchy. FIGS. 8A–F illustrate an exemplary overall application of a method of module placement according to an aspect of the present invention. Initially, in FIG. 8A, a circuit graph is provided comprising modules 800 connected by edges 801, the edges having slack values assigned according to the geometry aware slack distribution algorithm of the present invention. In addition, clusters 802 are formed from critical nets. In FIG. 8B, a mincut is performed to reduce the number of edges crossing cutlines 803 at a first level of hierarchy (top level 1). Next, FIG. 8C illustrates timing windows 805 generated for each module 800 on a placement grid 807, where each of the modules are assigned to their respective timing window at level 1 of the hierarchy. It is important to note that the cycle (f, b, d) was placed simultaneously at level 1. Once the modules in the first hierarchy are placed, mincut is performed in FIG. 8D on the set of edges on the cutlines (represented by dotted lines) at a next level of hierarchy (level 2). Then, in FIG. 8E the modules attached to the nets (represented by solid lines in FIG. 8D) are placed on the placement grid 807. FIG. 8F illustrates a next level of hierarchy (level 3) of the top-down placement process. Note that module c is not assigned to an exact location until this lower level (level 3) of hierarchy is processed.

Figures 9A, 9B:
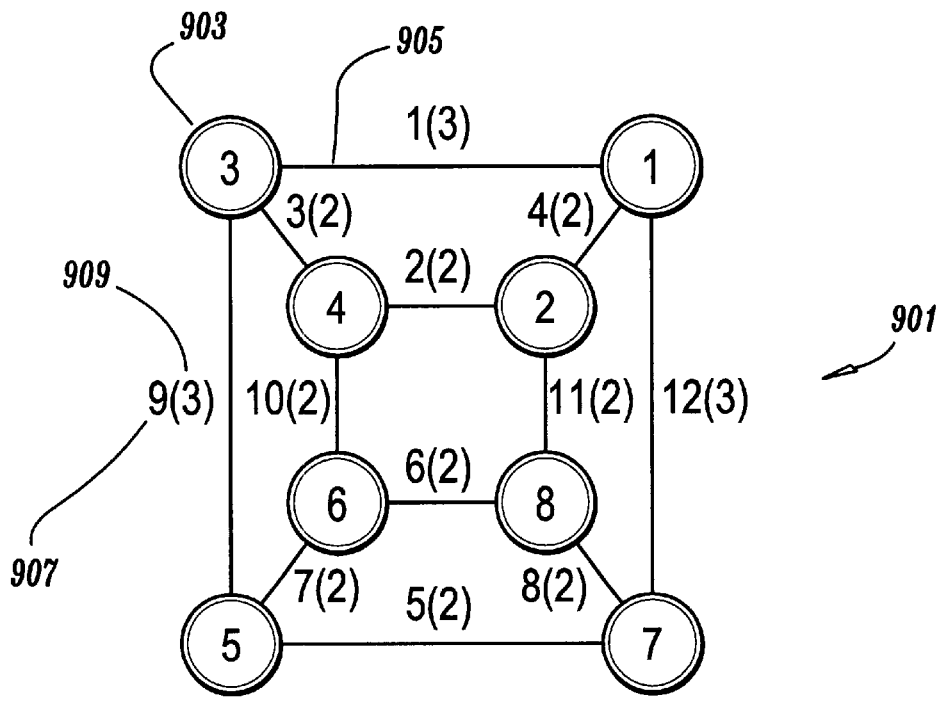
FIG. 9A depicts another example of an initial circuit graph G=(V, E) comprising node labels V (V=1, 2, . . . , 8) attached by edges E.
FIG. 9B illustrates an exemplary placement grid having fixed labeling comprising bin and channel labels.

FIG. 9A depicts another example of an initial circuit graph G=(V, E) 901 comprising node labels V 903 (V=1, 2, . . . , 8) attached by edges E 905. Each edge 905 includes an edge label comprising an edge ID 907 (E=1, 2, ..., 12) and a given feasible slack value 909. Each slack value is assigned using, for example, a geometry-aware slack distribution algorithm according to an aspect of the present invention satisfying geometric constraints such as triangle parity and inequality.

FIG. 9B illustrates an exemplary placement grid 910 having fixed labeling comprising bin and channel labels (addresses). Each quadrant comprises 9 bins; for example, quadrant 912 includes bins 1, 5, 6, 7, 8, 21, 22, 23 and 24. Bin 1 includes bins 21–24, bin 5 includes 21 and 22, bin 7 includes bins 23 and 24, bin 6 includes bins 22 and 23, and bin 8 includes bins 21 and 24. Each bin is labeled in a counter-clockwise fashion within each quadrant; bins 1–4 are also labeled in a counter-clockwise fashion starting from quadrant 912. Placement grid includes channel labels for labeling each of the four cutlines. separating each quadrant (C=c11, c12, ... c42).

Figure 9C:
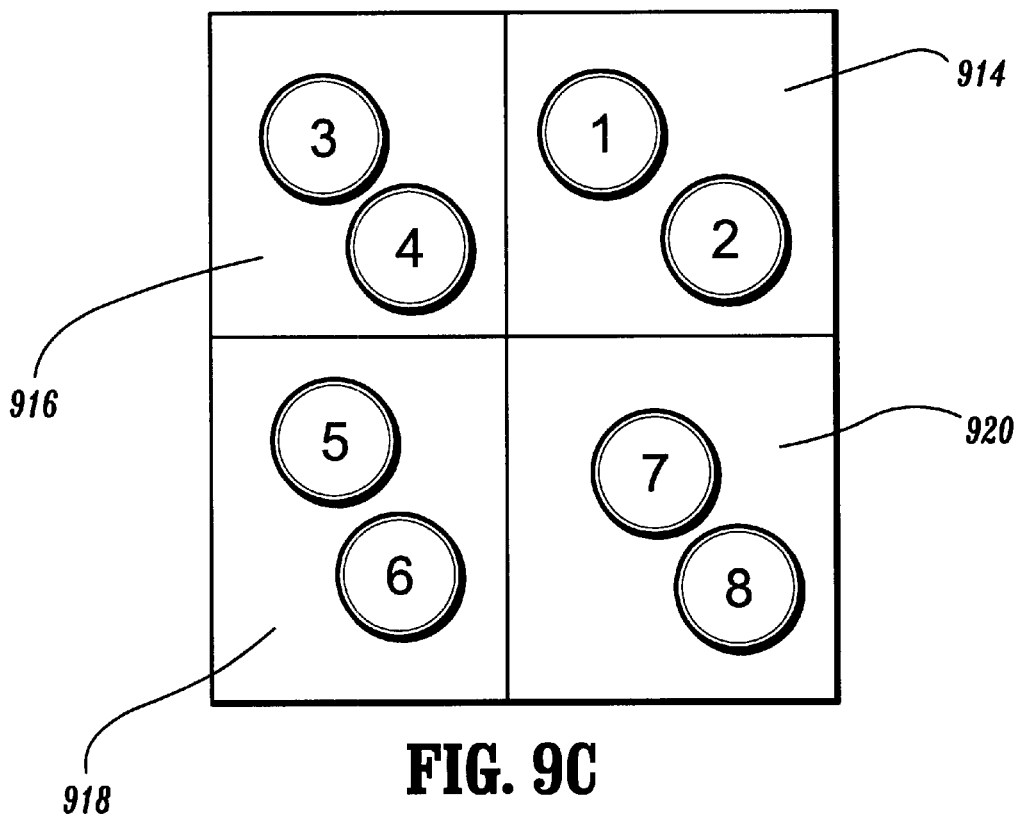
FIG. 9C illustrates an exemplary timing-driven partitioning of the circuit graph of FIG. 9A into four quadrants based on a min-slack cut for maximizing resource balancing.
Figure 9D:
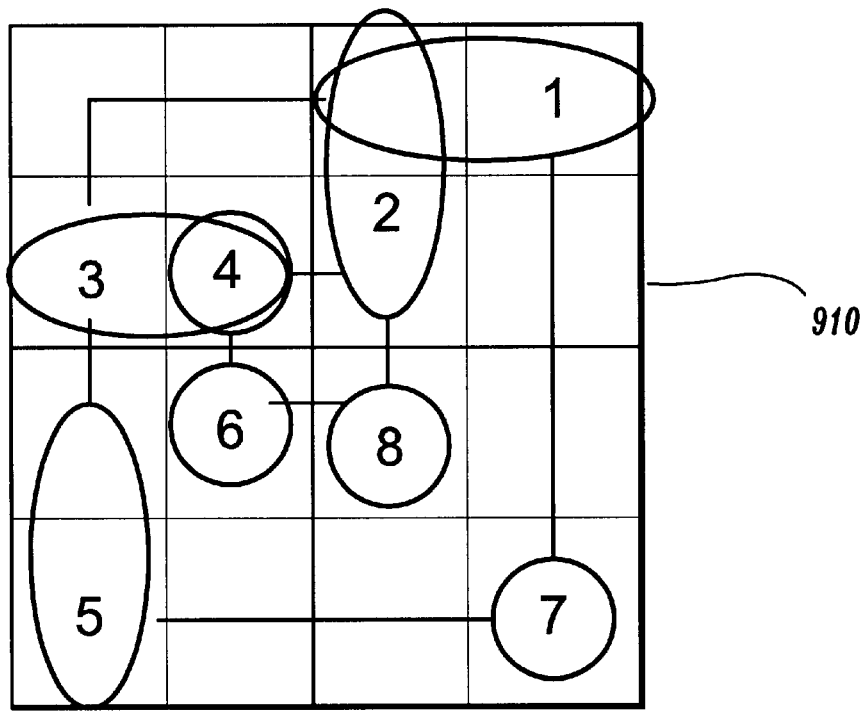
FIG. 9D illustrates an exemplary timing-closed placement of the modules and edges of FIG. 9A onto the placement grid of FIG. 9B according to an aspect of the present invention

FIG. 9C illustrates an exemplary timing-driven partitioning of the circuit graph 901 into four quadrants 914, 916, 918 and 920 based on a min-slack cut for maximizing resource balancing. The circuit graph is partitioned into segments such that global nets (nets which span multiple segments) are minimized. FIG. 9D illustrates an exemplary timing-closed placement of the modules 903 onto the placement grid 910 and nets (edges) into channels according to an aspect of the present. invention (the bin and channel labels here are not shown). Each module is placed into a target timing-closed window region, for example, module 1 is placed in bin 5, module 2 in bin 6, module 4 in bin 28, etc. The placement is situated such that straight connections and window sizes are maximized. Note that in the FIG. 9D, module 1 is allocated to bin 5 rather than assigning to an exact basic bin location. The exact module placements are deferred to a lower level of hierarchy.

The goal is to assign each module to a target timing-closed window region. A linear programming algorithm can be used to find an assignment of the modules.

The linear program described below has the following, constraints with (0, 1) variable of yibj, xibj, and xicj, where yibj=1 if a cell i is assigned to timing window j, xibj=1 if a net i is assigned to bin j, and xicj=1 if a net i is assigned to cut-channel j. To assign cells to bins and nets to channels, the labels as shown in FIG. 9B are used here for illustrative purposes.

Linear Programming Algorithm: Module Assignment

Maximize TW+ST, where TW is the size of timing windows assigned to nodes and ST is the set of configurations for straight connections. That is: max:

$$w13c11 + w13c12 + w24c11 + w24c12 + w75c31 + w75c32 + w86c31 + w86c32 + w35c21 +$$

$$w35c22 + w46c21 + w46c22 + w28c41 + w28c42 + w17c41 + w17c42 + y1b5 + y1b6 + y1b7 +$$

$$y1b8 + y2b6 + y2b7 + y3b9 + y3b10 + y3b11 + y3b12 + y4b11 + y4b12 + y5b13 + y5b14 +$$

$$y5b15 + y5b16 + y6b13 + y6b16 + y7b17 + y7b18 + y7b19 + y7b20 + y8b17 + y8b18;$$

Subject to:

$$YOR9 - 2001 - 0002US1\ (8728 - 477)$$

Assingnment Constraint: all possible configurations inside timing-windows $$y1b5 + y1b6 + y1b7 + y1b8 + y1b21 + y1b22 + y1b23 + y1b24 = 1;$$

$$y3b9 + y3b10 + y3b11 + y3b12 + y3b25 + y3b26 + y3b27 + y3b28 = 1;$$

$$y5b13 + y5b14 + y5b15 + y5b16 + y5b29 + y5b30 + y5b31 + y5b32 = 1;$$

$$y7b17 + y7b18 + y7b19 + y7b20 + y7b33 + y7b34 + y7b35 + y7b36 = 1;$$

$$y2b6 + y2b7 + y2b22 + y2b23 + y2b24 = 1;$$

$$y4b11 + y4b12 + y4b25 + y4b27 + y4b28 = 1;$$

$$y6b13 + y6b16 + y6b29 + y6b30 + y6b32 = 1;$$

$$y8b17 + y8b18 + y8b33 + y8b34 + y8b35 = 1;$$

Net Connectivity Constraint

/* center nets with slacks = 3 radius = 3 from center* /

$$y1b5 + y1b6 + y1b7 + y1b8 + y1b21 + y1b22 + y1b23 + y1b24 =$$

$$y3b9 + y3b10 + y3b11 + y3b12 + y3b25 + y3b26 + y3b27 + y3b28;$$

$$y3b9 + y3b10 + y3b11 + y3b12 + y3b25 + y3b26 + y3b27 + y3b28 =$$

$$y5b13 + y5b14 + y5b15 + y5b16 + y5b29 + y5b30 + y5b31 + y5b32;$$

$$y5b13 + y5b14 + y5b15 + y5b16 + y5b29 + y5b30 + y5b31 + y5b32 =$$

$$y7b17 + y7b18 + y7b19 + y7b20 + y7b33 + y7b34 + y7b35 + y7b36;$$

-continued $$y7b17 + y7b18 + y7b19 + y7b20 + y7b33 + y7b34 + y7b35 + y7b36 =$$
$$y1b5 + y1b6 + y1b7 + y1b8 + y1b21 + y1b22 + y1b23 + y1b24;$$

/* center nets with slacks = 2 radius = 2 from center* /

$$y2b6 + y2b7 + y2b22 + y2b23 + y2b24 = y4b11 + y4b12 + y4b25 + y4b27 + y4b28;$$
$$y4b11 + y4b12 + y4b25 + y4b27 + y4b28 = y6b13 + y6b16 + y6b29 + y6b30 + y6b32;$$
$$y6b13 + y6b16 + y6b29 + y6b30 + y6b32 = y8b17 + y8b18 + y8b33 + y8b34 + y8b35;$$
$$y8b17 + y8b18 + y8b33 + y8b34 + y8b35 = y2b6 + y2b7 + y2b22 + y2b23 + y2b24;$$

/* side nets with *slack2** /

$$y1b5 + y1b6 + y1b7 + y1b8 + y1b21 + y1b22 + y1b23 + y1b24 =$$
$$y2b6 + y2b7 + y2b22 + y2b23 + y2b24;$$
$$y3b9 + y3b10 + y3b11 + y3b12 + y3b25 + y3b26 + y3b27 + y3b28 =$$
$$y4b11 + y4b12 + y4b25 + y4b27 + y4b28;$$
$$y5b13 + y5b14 + y5b15 + y5b16 + y5b29 + y5b30 + y5b31 + y5b32 =$$
$$y6b13 + y6b16 + y6b29 + y6b30 + y6b32;$$
$$y7b17 + y7b18 + y7b19 + y7b20 + y7b33 + y7b34 + y7b35 + y7b36 =$$
$$y8b17 + y8b18 + y8b33 + y8b34 + y8b35;$$

Figure 10A:
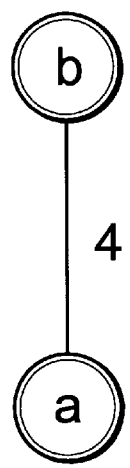
FIGS. 10A–C illustrate exemplary steps of generating a timing window for level i considering timing windows generated in previous levels i=1 and i=2.
Figure 10B:
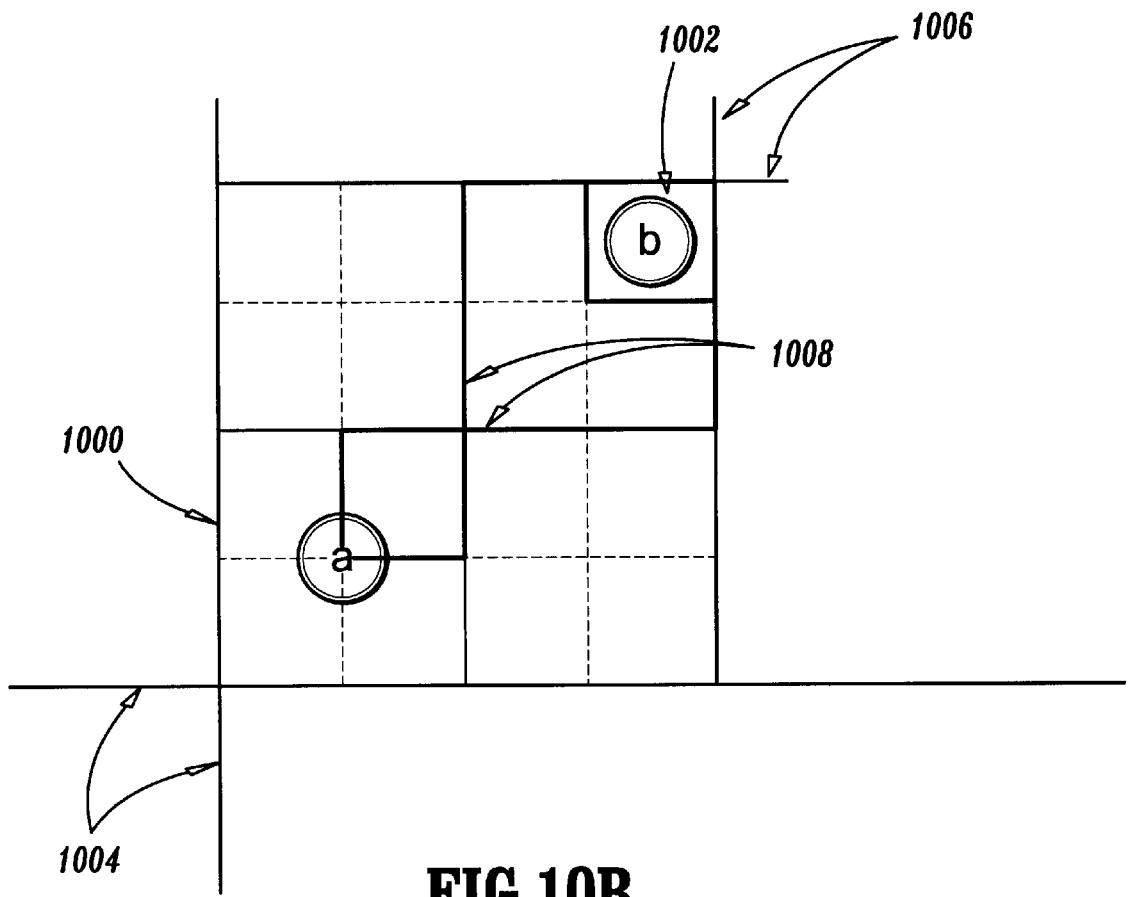
Figure 10C:
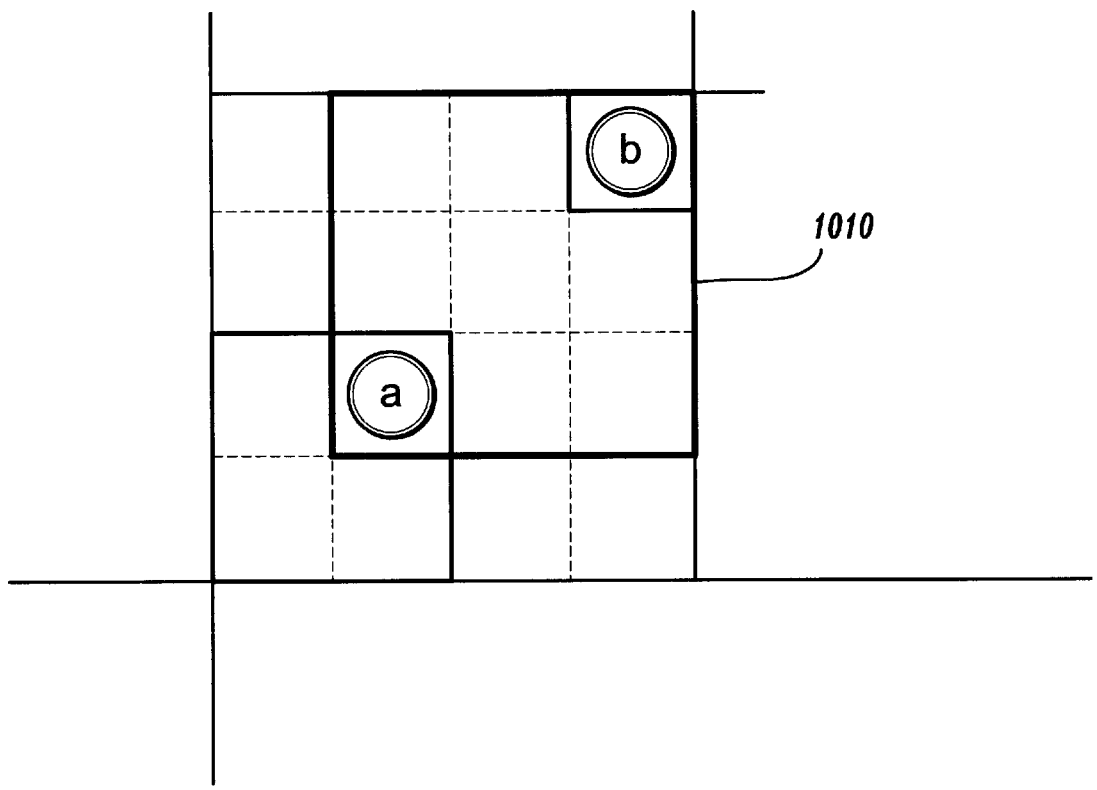

FIGS. 10A–C illustrate exemplary steps of generating a timing window for level i considering timing windows generated in previous levels i=1 and i=2. FIG. 10A illustrates a given subgraph of an edge (a, b) having a slack value of 4. FIG. 10B illustrates a timing window 1000 generated at level i−2 (here, a highest level of hierarchy) for module a, and a timing window 1002 generated for module b at level i−1 (a next lower level of hierarchy). FIG. 10B includes cut lines generated at level i−2 (1004), cut lines generated at level i−1 (1006) and cutlines at level i (1008). The timing window for edge (a, b) is generated at a current level i such that $\Box(a^{i-2}) \cap \Box(a^i) \neq \emptyset$ and $\Box(b^{i-2}) \cap \Box(b^i) \neq \emptyset$ (we refer to the constraints as timing window closure constraints), where $\Box(a^i)$ denotes the timing window for node a at level i of the top-down partition. A top-down partition is used here to get a more exact location for each module in the lower levels of the hierarchy. Here, module a for example, is assigned to an address in the highest level of hierarchy, but not to an exact location. In the current level i, module a is assigned to the upper right bin of timing window 1000. FIG. 10C illustrates an exemplary timing window 1010 generated for edge (a, b) at level i.

Note that the lower level of hierarchy where the possibility of overflow is increased has a smaller configuration space. Therefore, a feasible solution can be found by using a set of different slack distributions as well as increasing the number of timing window configurations.

Thus, an effective timing-driven placement that also takes the routing congestion and wirelength into consideration is reached where all nets meet timing constraints with absolute timing budgets. Based on these features, good global placement results can be achieved without excessive computation time.

Figure 11A:
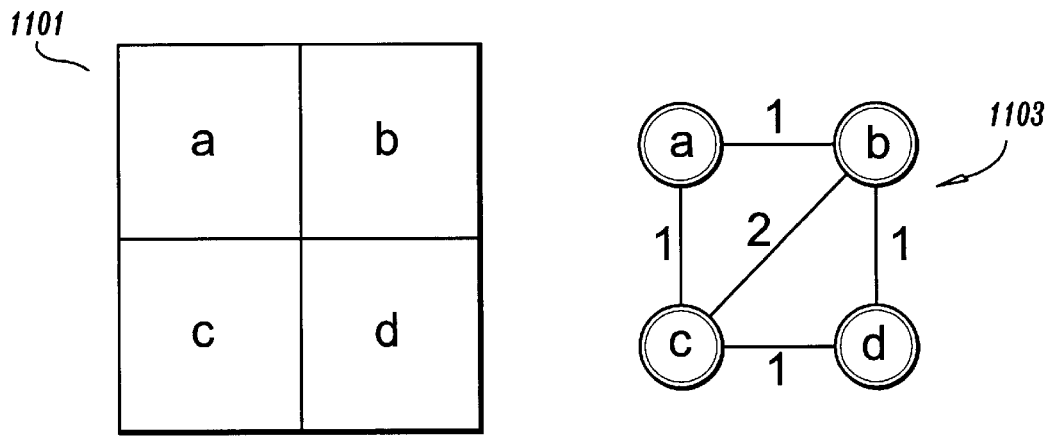
FIG. 11A and 11B illustrate exemplary formations of circuit graphs associated with a multiple-unit cell such that there are imaginery edges between two adjacent basic cells with a corresponding edge weight.

It is to be noted that the basic algorithms described in this paper can be easily extended to cells with different sizes such that cell width and height are multiples of basic units. For example, as shown in FIG. 11A, a graph 1103 associated with a multiple-unit cell 1101 can be formed such that there are imaginery edges between two adjacent basic cells with a corresponding edge weight. For example, here the edge weight corresponds to a fixed timing budget (one grid unit corresponds to a unit timing budget).

Figure 11B:
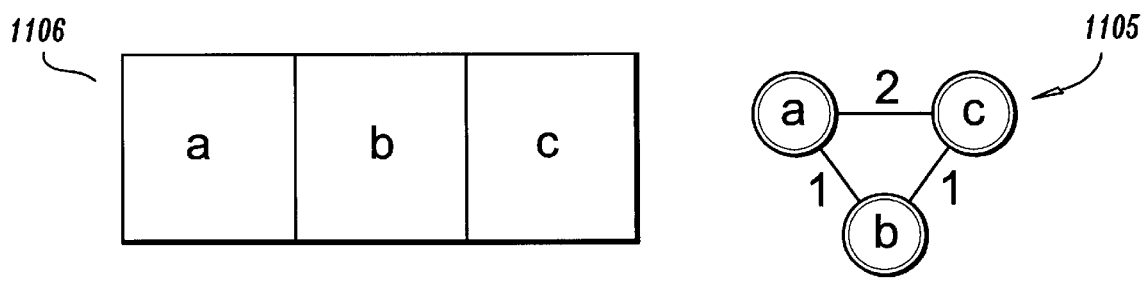

In FIG. 11B, the graph 1105 can generate different shapes (e.g., a straight or bended shape). To generate a particular shape of a multiple-sizes cell 1106, an edge can be assigned an attribute which regards to its corresponding shape. For example, graph 1105 corresponds to an alternate placement configuration such that cell a is above cell b and cell c is to the right of cell b. Here, the attributes can be, for example, (a, c):L, (a, b):|, (b, c):−, where "L", "|" and "−" correspond to L-shaped, horizontal and vertical placement respectively, of two cells.

Although illustrative embodiments of the present invention have been described herein with reference to the accompanying drawings, it is to be understood that the present invention is not limited to those precise embodiments, and that various other changes and modifications maybe affected therein by one skilled in the art without departing from the scope or spirit of the invention. All such changes and modifications. are intended to be included within the scope of the invention as defined by the appended claims.

What is claimed is:

1. A method for placing circuit elements on semiconductor chips comprising the steps of:
   a) creating a circuit graph including cuttines, said circuit graph comprising said circuit elements connected by nets for placement on a placement grid;
   b) clustering critical nets in the circuit graph;
   c) assigning a timing budget for each net using at least one of a plurality of slackdistribution algorithms satisfying at least one geometric constraint;
   d) partitioning the circuit graph using a mincut algorithm;
   e) generating a timing window region on the placement grid for each net which is less than or equal to each net's respective timing budget; and
   f) assigning the circuit elements attached to each net to each of their respective timing window regions.

2. The method of claim 1, wherein the step of partitioning further comprises:

performing a connectivity aware slack reassignment on the circuit graph to assign densely connected clusters a lower timing budget and weakly connected clusters a higher timing budget; and partitioning the circuit graph into four subgraphs to reduce a number of edges crossing cutlines at a first level of hierarchy.

3. The method of claim 1, wherein the placement grid comprises a plurality of bins for placement of the circuit elements, and channels for placement of the nets.

4. The method of claim 1, wherein the geometric constraint is a triangle inequality rule or a triangle parity rule.

5. The method of claim 4, wherein the step of assigning a timing budget further comprises using a geometry constrained slack reassignment algorithm for assigning timing budgets which satisfy the triangle inequality rule for every cycle in the circuit graph.

6. The method of claim 4, wherein the step of assigning a timing budget further comprises using a geometry constrained slack rebudgetting algorithm for assigning timing budgets which satisfy the triangle inequality rule for every cycle in the circuit graph.

7. The method of claim 4, wherein the step of assigning a timing budget further comprises using a geometry constrained slack rebudgetting algorithm for assigning timing budgets which satisfy the triangle inequality rule and the triangle parity rule.

8. The method of claim 4, wherein the triangle inequality rule provides that a sum of the timing budgets of any two edges of a cycle is equal to or greater than the timing budget of the third edge.

9. The method of claim 4, wherein the triangle parity rule provides that a sum of the timing budgets of any two edges of a cycle is of a same parity as the timing budget of the third edge.

10. A method for determining placement of circuit elements comprising the steps of:

describing a circuit image as a graph comprising circuit elements connected by edges;

assigning a timing budget for each edge using a geometry-aware slack distribution algorithm which satisfies at least one geometric constraint;

generating a timing window region on a placement grid for each edge, said timing window region being equal to or less than the timing budget for the respective edge; and assigning the circuit elements attached to each edge to each of their respective timing window regions.

11. The method of claim 10, wherein the geometric constraint is a triangle inequality rule or a triangle parity rule.

12. program storage device readable by a machine, tangibly embodying a program of instructions executable by the machine to perform the method steps for placing circuit elements on semiconductor chips, the method comprising the steps of:

a) creating a circuit graph including cutlines, said circuit graph comprising said circuit elements connected by nets for placement on a placement grid;

b) clustering critical nets in the circuit graph;

c) assigning a timing budget for each net using at least one of a plurality of slack distribution algorithms satisfying at least one geometric constraint;

d) partitioning the circuit graph using a mincut algorithm;

e) generating a timing window region on the placement grid for each net which is less than or equal to each net's respective timing budget; and f) assigning the circuit elements attached to each net to each of their respective timing window regions.

13. The program storage device of claim 12, wherein the step of partitioning further comprises:

performing a connectivity aware slack reassignment on the circuit graph to assign densely connected clusters a lower timing budget and weakly connected clusters a higher timing budget; and partitioning the circuit graph into four subgraphs to reduce a number of edges crossing cutlines at a first level of hierarchy.

14. The program storage device of claim 12, wherein the placement grid comprises a plurality of bins for placement of the circuit elements, and channels for placement of the nets.

15. The program storage device of claim 12, wherein the geometric constraint is a triangle inequality rule or a triangle parity rule.

16. The program storage device of claim 15, wherein the step of assigning a timing budget further comprises using a geometry constrained slack reassignment algorithm for assigning timing budgets which satisfy the triangle inequality rule for every cycle in the circuit graph.

17. The program storage device of claim 15, wherein the step of assigning a timing budget further comprises using a geometry constrained slack rebudgetting algorithm for assigning timing budgets which satisfy the triangle inequality rule for every cycle in the circuit graph.

18. The program storage device of claim 15, wherein the step of assigning a timing budget further comprises using a geometry constrained slack rebudgetting algorithm for assigning timing budgets which satisfy the triangle inequality rule and the triangle parity rule.

19. The program storage device of claim 15, wherein the triangle inequality rule provides that a sum of the timing budgets of any two edges of a cycle is equal to or greater than the timing budget of the third edge.

20. The program storage device of claim 15, wherein the triangle parity rule provides that a sum of the timing budgets of any two edges of a cycle is of a same parity as the timing budget of the third edge.

* * * * *